(12) United States Patent
Maezawa et al.

(10) Patent No.: US 7,561,114 B2
(45) Date of Patent: Jul. 14, 2009

(54) ELECTROMAGNETIC INTERFERENCE SUPPRESSOR, ANTENNA DEVICE AND ELECTRONIC INFORMATION TRANSMITTING APPARATUS

(75) Inventors: Makoto Maezawa, Yamatokohriyama (JP); Takahiko Yoshida, Yamatokohriyama (JP); Yoshiharu Kiyohara, Yamatokohriyama (JP); Shinichi Sato, Yamatokohriyama (JP); Haruhide Go, Yamatokohriyama (JP)

(73) Assignee: Nitta Corporation, Osaka (JP)

( * ) Notice: Subject to any disclaimer, the term of this patent is extended or adjusted under 35 U.S.C. 154(b) by 68 days.

(21) Appl. No.: 11/792,089

(22) PCT Filed: Dec. 5, 2005

(86) PCT No.: PCT/JP2005/022320

§ 371 (c)(1),
(2), (4) Date: Jun. 1, 2007

(87) PCT Pub. No.: WO2006/059771

PCT Pub. Date: Jun. 8, 2006

(65) Prior Publication Data

US 2007/0252771 A1 Nov. 1, 2007

(30) Foreign Application Priority Data

Dec. 3, 2004 (JP) ............................. 2004-350615

(51) Int. Cl.
*H01Q 1/52* (2006.01)

(52) U.S. Cl. ........................................ 343/841; 428/447

(58) Field of Classification Search ................. 343/841, 343/700 MS; 428/447, 448, 403, 692.1
See application file for complete search history.

(56) References Cited

U.S. PATENT DOCUMENTS

| 6,214,454 | B1 * | 4/2001 | Kanda et al. | ............. 428/294.7 |
| 6,869,683 | B2 * | 3/2005 | Sakurai et al. | ............. 428/448 |
| 7,113,123 | B2 * | 9/2006 | Saito et al. | ...................... 342/1 |
| 7,323,214 | B2 * | 1/2008 | Wakayama et al. | ......... 427/127 |
| 7,390,567 | B2 * | 6/2008 | Matsukawa et al. | ......... 428/403 |
| 2006/0214132 | A1 * | 9/2006 | Hirata et al. | ............. 252/62.54 |
| 2007/0196671 | A1 * | 8/2007 | Kobayashi | .................. 428/447 |

FOREIGN PATENT DOCUMENTS

| JP | 07-212079 | 8/1995 |
| JP | 2001-126910 | 5/2001 |
| JP | 2002-299112 | 10/2002 |
| JP | 2002-371138 | 12/2002 |
| JP | 2003-229694 | 8/2003 |

\* cited by examiner

*Primary Examiner*—Hoang V Nguyen
(74) *Attorney, Agent, or Firm*—Clark & Brody

(57) ABSTRACT

An electromagnetic interference suppressor of substantially unpressurized sheet form is obtained by applying and drying a magnetic paint, and comprises 30 to 80% by volume of soft magnetic powder and 20 to 70% by volume of a binder. The binder is an elastomer or a resin that a glass transition point and/or a softening point is 50° C. or more and a storage modulus (E') is $10^7$ Pa (JIS K 7244-1) or more in a state containing neither solvent nor filler at room temperature. This electromagnetic interference suppressor exerts a superior electromagnetic interference suppressing effect.

20 Claims, 14 Drawing Sheets

Fig. 13
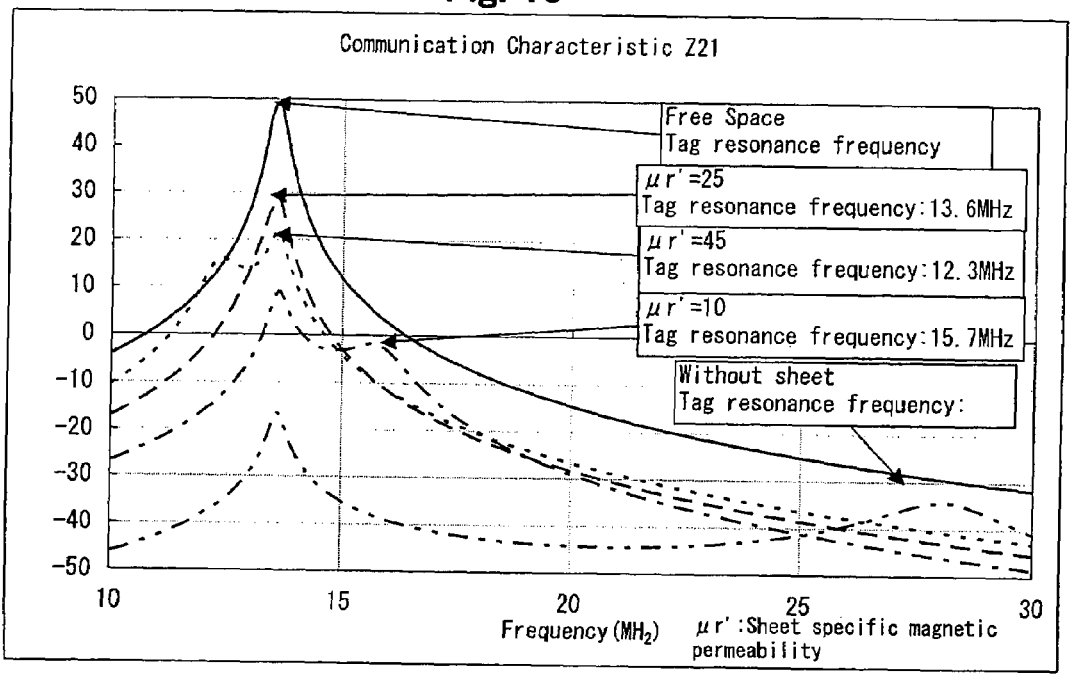
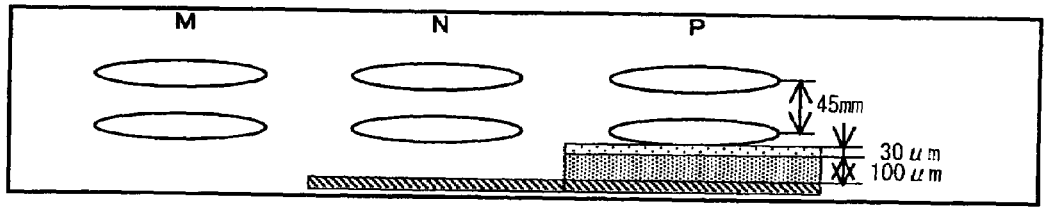
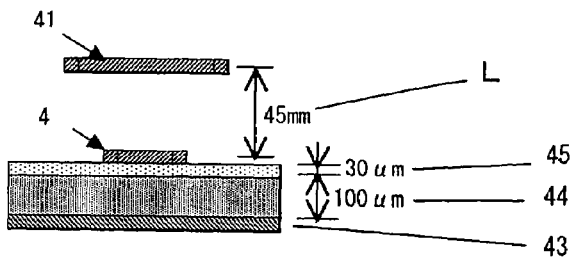
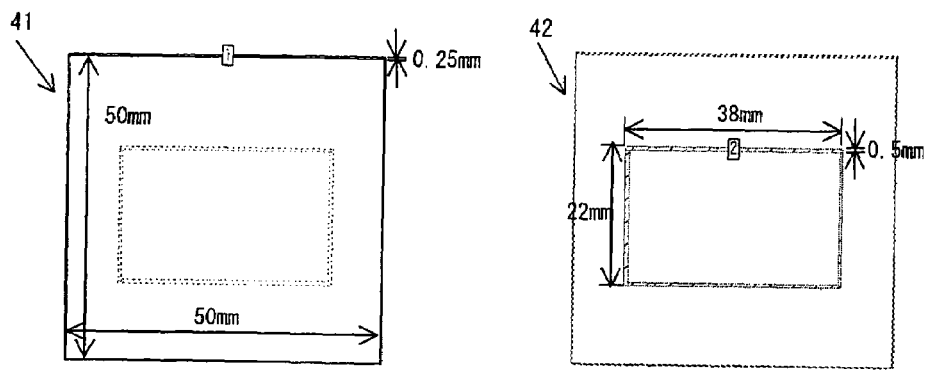

ELECTROMAGNETIC INTERFERENCE SUPPRESSOR, ANTENNA DEVICE AND ELECTRONIC INFORMATION TRANSMITTING APPARATUS

FIELD OF THE INVENTION

The present invention relates to an electromagnetic interference suppressor which is used for suppressing electromagnetic interference caused by interference of unnecessary electromagnetic waves inside an electronic apparatus, and more particularly relates to an electromagnetic interference suppressor used for reducing influences from neighboring metal, so as to improve radio communications that use frequencies (for example, those frequencies of 135 KHz or less, 13.56 MHz or the like) of an electromagnetic induction system in an apparatus having a IC tag function referred to as RF-ID (Radio Frequency Identification), and an antenna device and an electronic information transmitting apparatus using such a suppressor.

BACKGROUND ART

In recent years, various electronic apparatuses have been widely used, and those apparatuses include domestic electric appliances such as televisions, computers such as personal computers, mobile communication apparatuses such as mobile telephones and medical equipment. Unnecessary electromagnetic waves released from these electronic apparatuses give influences to other electronic apparatuses to cause adverse effects such as malfunction. For this reason, an electromagnetic interference suppressor, which removes or shields those unnecessary electromagnetic waves, is used in such electronic apparatuses.

Here, recently, the above-mentioned electronic apparatuses have been rapidly improved to provide high-speed, light-weight and thin structures, and miniaturized products, so that the packaging density of electronic parts to a circuit has become extremely higher. For this reason, along with an increase in electromagnetic noise caused by electromagnetic interference between parts as well as between circuit substrates, there has been a higher possibility of occurrence of electromagnetic interference due to unnecessary electromagnetic waves also between parts as well as between circuit substrates within an electronic apparatus.

Moreover, mobile terminals (for example, mobile telephones, IC cards, and RF-ID systems such as tags) having an IC tag function that carries out radio communications by using electromagnetic waves centered on a 13.56 MHz band have been put into a practical use. In one of the applications, a receiving-use loop antenna is placed in a housing of a small-size, thin-type mobile telephone, and in this case, when a metal housing or the inner face of the housing that has been subjected to a conductivity-applying treatment, such as plating, for the purpose of electromagnetic wave shielding is located closely to the loop antenna, lines of a magnetic force of a magnetic field, generated around the loop antenna upon transmitting or receiving operation, travel in parallel with the metal surface to generate an eddy current on the metal surface to cause losses. Moreover, a magnetic field, generated by the eddy current is formed in such a direction as to cancel the first magnetic field (forming an anti-magnetic field), and since the resonance frequency is shifted, the magnetic field in the frequency to be used for communications attenuates greatly, resulting in a phenomenon that shortens the communication distance drastically.

One of the countermeasures to communication disturbance due to metal located near the loop antenna in radio communications caused by a magnetic coupling is to place a magnetic shield sheet (magnetic sheet) between the loop antenna and the housing. With respect to the magnetic shield sheet, for example, a sheet has been proposed in which the numeric value of the real part ($\mu'$) of a complex specific magnetic permeability is high at 13.56 MHz (which collects magnetic fluxes easily) and the numeric value of the imaginary part ($\mu''$) thereof is low (which hardly converts collected magnetic fluxes into heat). An electromagnetic interference suppressor which the present invention refers to is used for this magnetic shield sheet.

Patent Document 1 has disclosed that one of the countermeasures to suppress electromagnetic interference is to place a sheet-state electromagnetic interference suppressor formed by dispersing soft magnetic powder in a binder near an electronic part or circuit.

When the electromagnetic interference suppressor of this kind is used, a sheet having a high permeability in a range from several tens of MHz to several GHz is required. In order to achieve a high permeability, it has been proposed that soft magnetic powder having particles of not a spherical shape but a flattened shape is used and that the particles of this flattened soft magnetic powder are aligned along the surface of the electromagnetic interference suppressor sheet (Patent Document 2).

In order to easily achieve such an alignment, it is preferable to use a material having high flowability as a matrix material. For example, Patent Document 2 has disclosed a technique in which a magnetic paint formed by dissolving flattened soft magnetic powder and a polymer binder in an organic solvent is applied onto a peeling support member by using a doctor blade method, and dried thereon as a sheet. However, in the case when this processing method is used, since upon drying the solvent in the magnetic paint generates foam, a problem arises in that a large number of pores are formed in the sheet. When a large number of pores are generated, the electromagnetic interference suppressing effect is lowered drastically. Therefore, there have been strong demands for a method which can fill the soft magnetic powder with high density, while suppressing the generation of pores as little as possible.

On the other hand, Patent Document 3 has disclosed a method of producing a composite magnetic material, which relates to a method in which a mixed matter, obtained by mixing and kneading flattened magnetic powder and a binder, is formed into a sheet by a predetermined method, and allows the binder to contain a vinyl chloride-based resin having a glass transition point of 50° C. or more. In this method, however, in order to allow the resulting composite magnetic material to have high density, another pressing process is required in which the sheet, which has been film-formed and from which the solvent has been removed, is pressed by a rolling apparatus using a press and rollers.

[Patent Document 1] JP-A No. 7-212079
[Patent Document 2] JP-A No. 2003-229694
[Patent Document 3] JP-A No. 2001-126910

DISCLOSURE OF THE INVENTION

Problems to be Solved by the Invention

In the post processes (pressure processes) such as a pressing process and a calender process, a shearing force is applied to the sheet by using a press or the like so that voids inside the sheet are discharged, and by accelerating a sufficient flow of the binder even into a narrow gap between the filler particles, a densely filled state is achieved so that it becomes possible to greatly improve the specific gravity of the sheet. These post processes are important processes so as to optimally design material constants ($\in'$, $\in''$, $\mu'$, $\mu''$) of the sheet. However, the use of the pressing process and the like causes a disadvantage in that the production costs increase greatly.

Therefore, conventionally, there have been strong demands for a method which provides a sheet-state electromagnetic interference suppressor having high performances by using only the coating process.

The sheet-state electromagnetic interference suppressor is produced by processes in which: a solution is prepared by dissolving a binder in a solvent, and to this is added soft magnetic powder, and mixed and stirred therein, and the resulting solution is applied onto a support member by a coating device, and dried thereon. In the above-mentioned processes, in order to prepare a state in which no air (solvent traces) remains in the sheet, the following two methods are proposed: (a) the amount of air to be contained in the coating solution is made smaller; and (b) the amount of air after the coating process is made smaller. With respect to (a), (1) to minimize the amount of the solvent upon designing the coating solution, (2) to prevent foaming at the time of stirring and coating (to minimize the initial entrained air) and (3) to carry out defoaming immediately before the coating, are proposed. With respect to (b), (1) to make the volatilizing speed of the solvent faster than the sheet drying and solidifying speed is proposed.

In the actual production process, in order to increase the producing speed, a method is taken in which after the coating process and an air-drying process, the resulting sheet is immediately made to pass through a heating zone at a high temperature of the boiling point of the solvent or more. As a result, the relationship of sheet drying speed>solvent volatilizing speed is held, and since a coat film is formed only on the surface portion to which heat is first transmitted, the inner air (solvent) is not sufficiently discharged to cause pores therein, and the resulting problem is that the specific gravity of the sheet is not sufficiently raised.

The object of the present invention is to provide an electromagnetic interference suppressor that exerts a superior electromagnetic interference suppressing effect, with respect to a sheet-state electromagnetic suppressor obtained by applying a magnetic paint to be dried thereon. More specifically, it is to provide such an electromagnetic interference suppressor that is obtained only through a coating process and a drying process, without the necessity of post processes such as a pressing process and a calender process, and exerts high performances (high specific gravity and the subsequent optimal real part $\mu'$ and/or imaginary part $\mu''$ of a complex specific magnetic permeability) that are the same as those obtained by using the post processes.

Means for Solving the Problems

The inventors of the present invention have directed their attention particularly to the above-mentioned (b) and examined how to quickly draw air (solvent). As a result, the inventors of the present invention have found that by simply applying a magnetic paint thereto to be dried thereon, the reduction in electromagnetic interference suppressing effects due to influences of pores can be suppressed, and a high density apparatus can be obtained; thus, they have achieved to obtain an electromagnetic interference suppressor that is effectively used to suppress electromagnetic disturbance cause by interference of unnecessary electromagnetic waves.

That is, the electromagnetic interference suppressor of the present invention is provided with the following structures in order to solve the above-mentioned problems:

(1) The electromagnetic interference suppressor of substantially unpressurized sheet form, which is obtained by applying and drying a magnetic paint, comprising 30 to 80% by volume of soft magnetic powder and 20 to 70% by volume of a binder, wherein the binder is an elastomer or a resin having a glass transition point and/or a softening point of 50° C. or more and having a storage modulus (E') of $10^7$ Pa (JIS K 7244-1) or more in a state containing neither solvent nor filler at room temperature.

(2) The electromagnetic interference suppressor of substantially unpressurized sheet form, which is obtained by applying and drying a magnetic paint, comprising 30 to 80% by volume of soft magnetic powder and 20 to 70% by volume of a binder, wherein the binder is an elastomer or a resin having a glass transition point of room temperature or less, with the glass transition point and the softening point being allowed to satisfy the following equation (I), and having a storage modulus (E') of $10^7$ Pa (JIS K 7244-1) or more in a state containing neither solvent nor filler at room temperature.

[Equation 1]

$$\text{Softening point} - \text{Glass transition point} \geq 45° \text{ C.} \quad \text{(I)}$$

(3) The electromagnetic interference suppressor of substantially unpressurized sheet form, which is obtained by applying and drying a magnetic paint, comprising 30 to 80% by volume of soft magnetic powder and 20 to 70% by volume of a binder, wherein the binder comprises 30 to 80% by weight of an elastomer or a resin having a glass transition point of room temperature or more, and 20 to 70% by weight of an elastomer or a resin having a glass transition point of less than room temperature, these glass transition points being allowed to satisfy the following equation (II), and the elastomer or the resin has a storage modulus (E') of $10^7$ Pa (JIS K 7244-1) or more in a state containing neither solvent nor filler at room temperature.

[Equation 2]

$$Tg1 - Tg2 \geq 20° \text{ C.} \quad \text{(II)}$$

Tg1: glass transition point of room temperature or more

Tg2: glass transition point of less than room temperature (4) The electromagnetic interference suppressor of substantially unpressurized sheet form, which is obtained by applying and drying a magnetic paint, comprising 30 to 80% by volume of soft magnetic powder and 20 to 70% by volume of a binder, wherein the magnetic paint contains a solvent having a boiling point of (room temperature+40° C.) or more, and the binder is an elastomer or a resin having a glass transition point and/or a softening point of (room temperature+40° C.) or more and having a storage modulus (E') of $10^7$ Pa (JIS K 7244-1) or more in a state containing neither solvent nor filler at room temperature.

(5) The electromagnetic interference suppressor according to any of the above-mentioned (1) to (3) in which the drying process is a room temperature drying process.

(6) The electromagnetic interference suppressor according to the above-mentioned (4) in which the drying process is a forceful drying process.

(7) The electromagnetic interference suppressor according to any of the above-mentioned (1) to (4), which has a ratio of actual specific gravity/theoretical gravity of 0.5 or more.

(8) The electromagnetic interference suppressor according to any of the above-mentioned (1) to (4), containing a higher fatty acid salt.

(9) The electromagnetic interference suppressor according to the above mentioned (8) in which the higher fatty acid salt is zinc stearate.

(10) The electromagnetic interference suppressor according to any of the above-mentioned (1) to (4) in which the soft magnetic powder has a surface that is treated by a coupling agent or coated with a resin.

(11) The electromagnetic interference suppressor according to any of the claims 1 to 4, having a real part ($\in'$) and an imaginary part ($\in''$) of a complex specific dielectric constant as well as a real part ($\mu'$) and an imaginary part ($\mu''$) of a complex specific magnetic permeability.

(12) The electromagnetic interference suppressor according to any of the above-mentioned (1) to (4) in which in a frequency to be used in radio communications in an electromagnetic inductive system, the real part ($\mu'$) is set to 30 or more and the imaginary part ($\mu''$) is set to 6 or less in the complex specific magnetic permeability, and the real part ($\in'$) is set to 30 or more and the imaginary part ($\in''$) is set to 500 or less in the complex specific dielectric constant.

(13) The electromagnetic interference suppressor according to any of the above-mentioned (1) to (4) in which in a frequency range of 50 MHz to 1 GHz, the real part ($\mu'$) is set to 7 or more or the imaginary part ($\mu''$) is set to 5 or more in the complex specific magnetic permeability.

(14) The electromagnetic interference suppressor according to any of the above-mentioned (1) to (4) wherein a flame retarder and/or a flame-retardant auxiliary are contained so as to impart a flame resistant property thereto.

(15) The electromagnetic interference suppressor according to any of the above-mentioned (1) to (4) wherein an adhesion agent layer or a bonding agent layer attached to at least one of the surfaces thereof.

(16) The electromagnetic interference suppressor according to any of the above-mentioned (1) to (4) which has a thermal conductive property.

(17) A magnetic shield sheet, which is provided with: a conductive reflection layer; and a magnetic layer that is made of the electromagnetic interference suppressor according to any of the claims 1 to 4, and attached to at least one of the surfaces of the conductive reflection layer, is characterized in that a magnetic shield property in a range of 10 MHz to 1 GHz, obtained by a KEC method or an Advantest method, is set to 20 dB or more.

Here, the elastomer or the resin of the present invention may satisfy at least one conditions of the above-mentioned (1) to (4), or may simultaneously satisfy two or three or all the conditions thereof.

The antenna device of the present invention is provided with: an antenna element having a resonance frequency that is matched with a frequency to be used for radio communications; and the electromagnetic interference suppressor according to any of the above-mentioned (1) to (4), which is interposed between the antenna element and a communication disturbing member. The electronic information transmitting apparatus of the present invention uses the above-mentioned antenna device.

Effects of the Invention

In accordance with the electromagnetic interference suppressor described in any of the above-mentioned (1) to (4), since an elastomer or a resin having predetermined glass transition point and softening point is used as the binder, simply by applying this thereto to be dried thereon, the reduction in electromagnetic interference suppressing effects due to influences of pores can be suppressed and a high density can be achieved, and that it becomes possible to obtain a superior electromagnetic interference suppressing effect.

As described in (14), when the flame resistant property is imparted to the electromagnetic interference suppressor, it can be desirably used for applications that require a flame resistant. For example, electronic information transmitting apparatuses that carry out radio communications by using an antenna element, such as tags, readers and mobile telephones, sometimes require a flame resistant property.

As described in (15), when the adhesion agent layer or the bonding agent layer is attached to the surface of the electromagnetic interference suppressor, it becomes possible to paste the electromagnetic interference suppressor to another article, and consequently to easily attach the electromagnetic interference suppressor thereto.

As described in (16), in the case when a thermal conductivity is imparted to the electromagnetic interference suppressor, for example, even if a communication means, a power supply means or the like, which includes an IC, is used near a means that forms a heat generating source, it becomes possible to restrain a temperature rise in the heat generating source and its periphery, and consequently to prevent a reduction in performances due to exposure to a high temperature.

In accordance with the antenna device of the present invention, even when an antenna element is placed near a member (communication disturbing member) having a portion made from a conductive material such as a metal member, the antenna element can be desirably used for radio communications and transmitting operations of electronic information.

Moreover, in accordance with the electronic information transmitting apparatus of the present invention, even when an antenna element is placed near a communication disturbing member such as a metal member, it is possible to achieve a desirable electronic information transmitting process.

BRIEF DESCRIPTIONS OF THE DRAWINGS

FIGS. 1(a) to 1(d) are cross-sectional views that respectively show one example of a magnetic shield sheet formed by using an electromagnetic interference suppressor of the present invention.

FIG. 2 is a cross-sectional view that shows one example of the electromagnetic interference suppressor of the present invention.

FIGS. 3(a) to 3(c) are drawings that show a structure of a tag to be used in the electromagnetic interference suppressor of the present invention.

FIG. 13 is a drawing that shows the results of simulation indicating the position of resonance frequency and the calculation conditions thereof in the tag formed by using the electromagnetic interference suppressor of Example 11.

DESCRIPTION OF REFERENCE NUMERALS

Figure 1:
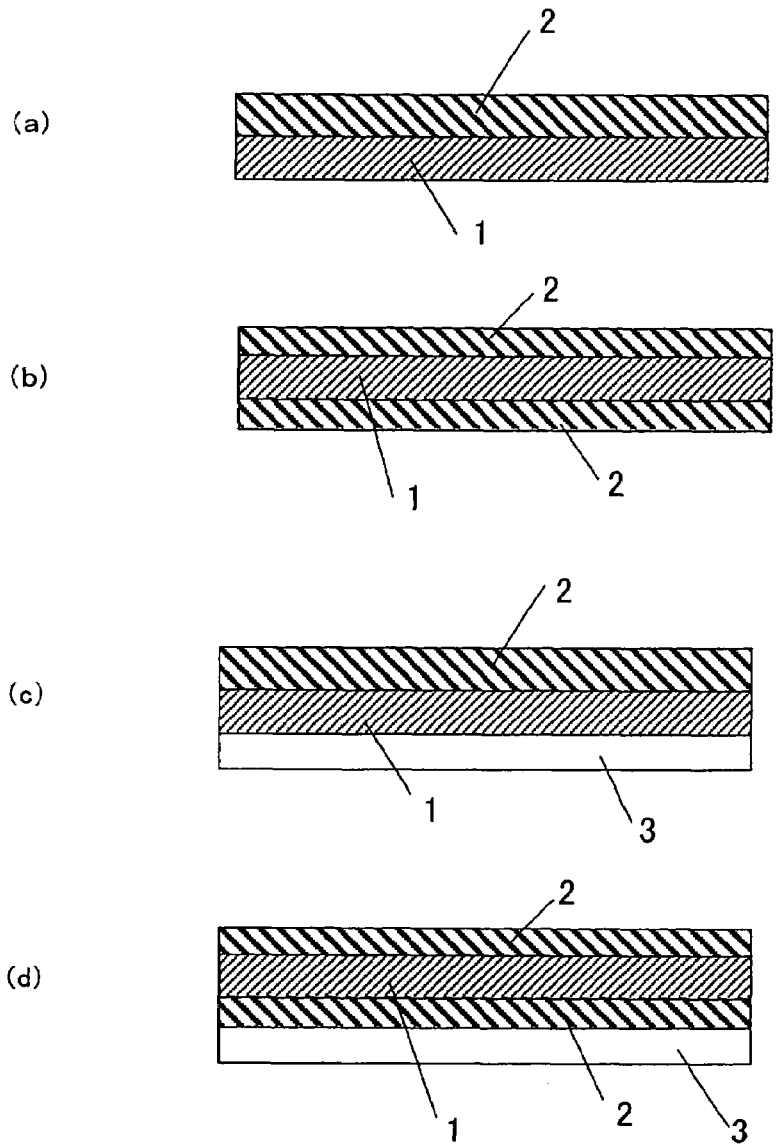

1 Conductive reflection layer
2 Electromagnetic interference suppressor
3 Pasting layer
4 Antenna element
5 IC chip
6 Substrate
7 Electromagnetic interference suppressor
8 Communication disturbing member
12 Communication disturbing member
15 Tag
23 Electronic device
30 Tag
43 Communication disturbing member
44 Electromagnetic interference suppressor
54 Electromagnetic interference suppressing sheet

PREFERRED EMBODIMENTS OF THE INVENTION

An electromagnetic interference suppressor in accordance with the present invention is mainly composed of soft magnetic powder and a binder, and mainly used in the form of a (thin magnetic) sheet.

With respect to the soft magnetic powder, examples thereof include: all the Fe-based alloys, such as magnetic stainless (Fe—Cr—Al—Si alloy), sendust (Fe—Si—Al alloy), permalloy (Fe—Ni alloy), silicon copper (Fe—Cu—Si alloy), Fe—Si alloy, Fe—Si—B (—Cu—Nb) alloy, Fe—Ni—Cr—Si alloy, Fe—Si—Cr alloy and Fe—Si—Al—Ni—Cr alloy. Moreover, ferrite or pure iron powder may be used. Amorphous alloys (Co-based, Fe-based, Ni-based and the like), electromagnetic soft iron and Fe—Al-based alloys may be used as well. These may be oxides, or may have an oxidized structure in one portion. With respect to the ferrite, examples thereof include: soft ferrite, such as Mn—Zn ferrite, Ni—Zn ferrite, Mn—Mg ferrite, Mn ferrite, Cu—Zn ferrite and Cu—Mg—Zn ferrite, or hard ferrite used as a material for permanent magnets. With respect to the Co-based oxides (Co—Zr—O-based, Co—Pb—Al—O-based and the like), granular films may be used. With respect to the Fe pure ferrite particles, for example, carbonyl iron powder may be used. With respect to the shape of the soft magnetic powder (spherical shape, flattened shape, fiber shape and the like), although not particularly limited, soft magnetic powder having a flattened shape with high permeability is preferably used. However, those having a flattened shape have difficulty in removing air (solvent) inside the sheet, and tend to fail to increase the specific gravity. These magnetic materials may be used as a simple substance, or a plurality of them may be blended and used. The average particle size of the soft magnetic powder or the major diameter of the flattened shaped soft magnetic powder is preferably set in a range from 1 to 300 μm, preferably, from 20 to 100 μm. Moreover, the aspect ratio of the soft magnetic powder having a flattened shape is preferably set in a range from 2 to 500, preferably, from 10 to 100. Here, the above-mentioned average particle size is a value obtained through measurements by a particle size distribution measuring device.

The surface of the soft magnetic powder is preferably subjected to a coupling agent treatment or a resin coating treatment. With this arrangement, the affinity to a binder, which will be described later, is improved. With respect to the coupling agent, examples thereof include: silane coupling agent, titanium-based coupling agent, aluminate-based coupling agent, amino-based coupling agent and cation-based coupling agent, and the amount of addition is preferably set to about 0.01 to 5% by weight to the soft magnetic powder. Moreover, with respect to the resin to be resin-coated, the same resin as the binder to be used or an elastomer, a resin or the like that is superior in affinity to the binder to be used is preferably used. With respect to this elastomer or resin, the same resin as those exemplified as the binder, which will be described later, may be used. The coating amount of the resin is preferably set to about 0.01 to 10% by weight to the soft magnetic powder. Moreover, in addition to the coupling agent treatment and the resin coating treatment, the soft magnetic powder may be surface-treated by other additives and the like. In this case, the amount of treatment is preferably set to about 0.01 to 10% by weight with respect to the soft magnetic powder.

With respect to the binder of the present invention, an elastomer or a resin may be used, and with respect to the elastomer, examples thereof include various elastomers (including thermoplastic elastomers), such as polyvinyl chloride-based elastomers, like polyethylene chloride, polystyrene-based, polyolefin-based, polyurethane-based, polyester-based, polyamide-based, fluorine-based and silicone-based elastomers.

With respect to the resin, examples thereof include: thermoplastic resins or thermosetting resins, such as polyester-based urethane resins (adipate-based, carbonate-based, and caprolactam ester-based resins), polyether-based urethane resin, polyvinyl acetal resin, polyethylene, polypropylene, AS resins, ABS resins, polystyrene, polyvinyl chloride, polyvinylidene chloride, polyvinyl acetate, ethylene-vinyl acetate copolymer, fluororesins, acryl-based resins, nylon, polycarbonate, polyethylene terephthalate, alkyd resins, unsaturated polyester, polysulfone, polyurethane resin (all the types except for those of the above-mentioned, except for those of polyester-based and polyether-based), phenolic resins, urea resins, epoxy resins, silicone resins, melamine resins, acrylic resins, acryl-based copolymer-based resins and alkyl acrylic-based resins. One of these elastomers or resins may be used alone, or those subjected to a modifying treatment (graft, copolymerizing, or chemical treatment) may be used, or those of composite-based (blended, polymer alloy, composite or the like) may be used. These may be blended in acrylic silicone, acrylic urethane, acrylic lacquer, various primers, fluorine-based paints, silicone-based paints and UV paints. To these elastomers, resins and the like, a functional group (polar group, such as glycidyl group, carboxyl group, sulfonic acid group, maleic acid group and amino group, for example, polar group that forms an ionomer by the use of a metal salt, a quaternary amine or the like) may be added in order to improve the cohesion.

The binder may be crosslinked. A crosslinking agent is added to a coating solution, and before having been gelled, this is applied and subjected to a heating process or the like so that the crosslinking reaction can be completed. The increase in the storage modulus (E') (which will be described later) of the binder by the use of this crosslinking reaction also effectively reacts on the solvent discharge.

The glass transition point and/or the softening point of the elastomer or the resin are preferably set to 50° C. or more, preferably, to 50 to 180° C., more preferably, to 80 to 180° C. When the glass transition point and/or softening point are less than 50° C., this state is not preferable because there is a reduction in actual specific gravity. This means that the glass transition point and/or the softening point are not located within the solvent drying temperature area, and this setting is in particular effective in the case when a room temperature drying process without heating and air blowing is carried out.

In the present invention, the glass transition point and the softening point are values obtained through measurements on the elastomer or resin by using a TMA (thermomechanical analyzer) or a DMA (dynamic viscoelastic modulus analyzer).

Another binder in the present invention is an elastomer or a resin which has a glass transition point lower than room temperature, with the glass transition point and the softening point being allowed to satisfy the aforementioned equation (I). In this case, since an electromagnetic interference suppressing sheet in a rubber state, which is superior in elasticity, can be obtained, the resulting sheet is easily handled. Here, the difference (softening point−glass transition point) of the aforementioned equation (I) is set to 45° C. or more, more preferably, from 70 to 200° C. In contrast, in the case when the difference (softening point−glass transition point) is less than 45° C., this state is not preferable since the actual specific gravity is lowered.

Still another binder in the present invention is formed by blending two kinds of elastomers or resins, and one of the elastomers or resins has a glass transition point Tg1 that is room temperature or more, the other has a glass transition point Tg2 of the other elastomer or resin being set to room temperature or less. The glass transition points Tg1 and Tg2 of these two kinds of elastomers or resins are allowed to satisfy the relationship of the aforementioned equation (II). The difference (Tg1−Tg2) of the aforementioned equation (II) is set to 20° C. or more, more preferably, from 80 to 150° C. In contrast, in the case when the difference (Tg1−Tg2) is less than 20° C., this state is not preferable since the actual specific gravity is lowered.

The blending ratio of these two kinds of elastomers or resins corresponds to 30 to 80 parts by weight of the elastomer or resin having a glass transition point of room temperature or more and 20 to 70 parts by weight of the elastomer or resin having a glass transition point of less than room temperature (in this case, the total amount of the two kinds of elastomers or resins is set to 100 parts by weight). In the case when the content of that having a glass transition point of room temperature or more is lower than 30 parts by weight and the content of that having a glass transition point of less than room temperature is higher than 70 parts by weight, this state is not preferable because the actual specific gravity is lowered. In contrast, in the case when the content of that having a glass transition point of room temperature or more is higher than 80 parts by weight and the content of that having a glass transition point of less than room temperature is lower than 20 parts by weight, this state is not preferable because the sheet elastic property is lost.

In the present invention, "room temperature" generally refers to 0 to 35° C.

Still another binder in the present invention is an elastomer or a resin that has a glass transition point and/or a softening point in a range from room temperature to room temperature+40° C. In this case, it is important to set the boiling point of a solvent to be contained in a magnetic paint out of the range from room temperature to room temperature+40° C., as will be described later.

This arrangement is made so that the solvent volatilizing speed and the sheet drying speed are made virtually equal to each other equally in the sheet as well as on the peripheral portion thereof, within a range from the coating temperature (room temperature) of a magnetic paint to 40° C. from the coating temperature (room temperature+40° C.). In the case when the glass transition point and/or the softening point are located within the range from room temperature to room temperature+40° C., the softening of the binder starts in the middle of the solvent volatilization, and as a result of excessive softening, the cohesion of the binder is not exerted sufficiently. Moreover, the solvent remains in the sheet to form voids, with the result that the actual specific gravity of the sheet fails to become higher. This arrangement is made by taking into consideration drying conditions (forceful drying) in a heated (warmed) atmosphere in a drying zone in an actual coating line. The forceful drying process includes a hot-air drying process.

In the binder of the present invention, the storage modulus (E') in a state without containing any solvent or filler (which will be described later) at room temperature is set to $10^7$ Pa or more (JIS K 7244-1). Preferably, the storage modulus (E') at room temperature is set to $10^8$ Pa or more. In order to deal with the forceful drying process, the storage modulus (E') is preferably set to $10^6$ Pa or more in the range from room temperature to room temperature+40° C. as well. More preferably, the storage modulus (E') at room temperature is set to $10^7$ Pa or more in the range from room temperature to room temperature+40° C. as well. This arrangement is made so that in a stage where the solvent is being released in the solvent volatilizing stage, the cohesion of the binder (polymer) itself is made higher to accelerate the spontaneous discharge of the solvent from the binder. Since air (solvent) spontaneously escapes quickly in the temperature range from room temperature to room temperature+40° C. (referred to as "air (solvent) discharging effect"), the modulus of the binder is also taken into consideration. The dynamic modulus (storage modulus) E' of the sheet is a value that is measured by using a tensile jig of a dynamic viscoelasticity measuring apparatus.

In other words, it has been found that, when the storage modulus (E') of a binder without solvent (volatilized) becomes greater, that is, to $10^7$ Pa or more, in comparison with a dynamic viscosity rate in a state where a solvent (that is, coating solution) is present (the dynamic viscosity rate η', found by a rheometer, is about $10^0$ to $10^5$ Pa·s in a shearing speed of $10^0$ to $10^3$ sec$^{-1}$), an air (solvent) discharging function is exerted because of a difference in modulus of elasticity due to drying of the solvent (solvent discharge), without the necessity of particularly providing a temperature difference).

In other words, although the modulus of elasticity is raised, since this is not caused by externally applied heat, the difference in modulus of elasticity between the outer surface and the inside is small so that air is sufficiently released also from the inside. In this state, by further raising the sheet modulus of elasticity by utilizing drying, the discharge of air (solvent) from the inside of the sheet progresses quickly. Since the modulus of elasticity of the binder is great in the absence of the solvent, the cohesion of the binder becomes stronger, with the result that air (solvent) is discharged so that the actual specific gravity of the sheet becomes higher. With respect to the method for increasing the storage modulus (E') of the sheet near room temperature, on the assumption that drying conditions in the case of natural drying (drying at room temperature) without using a forceful drying process (drying by the use of hot air or the like) after the coating process, the actual specific gravity after the natural drying is made higher by enhancing the cohesion of the binder (by raising the modulus of elasticity of the binder near room temperature).

The following description will discuss a method for raising the actual specific gravity of the sheet by using a forceful drying process. The gelling process (process of phase change) between a coating solution (state with a solvent) and a solid (dried state) is examined from the viewpoint of time dependence (by providing a state close to a fixed temperature although a heating temperature is partially applied) of a dynamic viscoelastic change (by using a shearing jig), and when changes in the storage shearing modulus (G') and the loss modulus (G") are followed, the drying speed of the solvent is reflected to the degree of rise of the storage shearing modulus (G'); therefore, when the rise of the storage shearing modulus (G') is quick and great, it is solidified while a high density dispersed state is being maintained, without causing any precipitation of the filler. As the storage shearing modulus (G') becomes higher, the storage modulus (E') of course becomes higher as well. However, as described earlier, this effect is not sufficiently exerted, in the case when only the peripheral face is first heated and cured during a heat-drying process. In the present invention, in order to achieve this effect positively as quick as possible, the range of the storage modulus (E') of the binder and the boiling point of the solvent are limited.

Here, the limitation to the boiling point of the solvent means that since volatilization by a drying process at a temperature below the boiling point without external heat application is preferable in order to stabilize the evaporation speed of the solvent, those solvents having a boiling point in a range from room temperature to room temperature+40° C. are not used. Abrupt volatilization at a low temperature range tends to cause a dried state only on the peripheral portion, resulting in residual air (voids). Imparting the range from room temperature to room temperature+40° C. is to provide a suitable heating range corresponding to a forceful drying process so as to maintain an evenly dispersed state by raising the storage modulus (E') as soon as possible. Moreover, the range from room temperature+40° C. with respect to the boiling point of the solvent in the present invention is set more specifically on the assumption of about 70° C. Even in the case of a mixed solvent formed by blending solvents of two kinds or more, the boiling point of at least one of the solvents blended is set out of the range from room temperature to room temperature+40° C.

The storage modulus (E') of the binder is set to $10^7$ Pa or more at normal temperature, and this value is preferably maintained at room temperature+40° C. At this time, the glass transition point and the softening point may be present in this temperature range, and it is only necessary to set the value of the storage modulus (E') to $10^7$ Pa or more. At this time, in the case when a rubber-state material having a low storage modulus (E') in the binder without any solvent (volatized state) within the range from room temperature to room temperature+40° C. (for example, E' is $10^6$ Pa or less at room temperature) is used, the air discharging performance is low, and the specific gravity is not raised sufficiently, failing to obtain a sheet having a high actual specific gravity only by the use of a coating process, which is a target sheet of the present invention. Here, the raised value of the storage modulus (E') of the binder may be achieved not only by the solvent drying effect, but also by an increase in the molecular weight of the binder and an intermolecular force between molecules, or by a chemical reaction such as a crosslinking process.

The above-mentioned method is used for raising the actual specific gravity in the drying stage (room temperature drying and forceful drying) after the coating process; however, as described earlier, with respect to the magnetic paint, the higher the viscosity prior to the coating process, the smaller the amount of the solvent becomes, and the resulting tendency is that solvent traces (air) generated in the drying process are reduced. In order to easily obtain the air (solvent) discharging effect, a coating process using a magnetic paint having a high viscosity is desirably used. The viscosity range is preferably set to $10^3$ to $10^6$ cps (B-type viscometer), more preferably, to $10^4$ to $10^5$ cps (B-type viscometer).

By using the above-mentioned methods, the actual specific gravity of a sheet after the coating process and drying process is raised. In particular, even when the sheet is allowed to pass through the drying zone of an actual coating apparatus with a higher coating speed (corresponding to the aforementioned forceful drying process), it becomes possible to obtain a sheet having a high specific gravity. For this reason, a pressure-applying process, which has been conventionally carried out, is no longer required. However, for example, in an attempt to compensate for insufficient alignment of the soft magnetic powder, a pressure-applying process, such as a simple calendering process, may be carried out in combination, if necessary.

With respect to the blending ratio between the soft magnetic powder and the binder, 30 to 80% by volume of the soft magnetic powder and 20 to 70% by volume of the binder are preferably blended, and 40 to 70% by volume of the soft magnetic powder and 30 to 60% by volume of the binder are more preferably blended. In the case when the content of the soft magnetic powder is lower than 30% by volume and the content of the binder is higher than 70% by volume, it is not possible to obtain a desired electromagnetic interference suppressing effect. In contrast, in the case when the content of the soft magnetic powder is higher than 80% by volume and the content of the binder is lower than 20% by volume, the resulting electromagnetic interference suppressor becomes brittle, making it difficult to carry out processing thereon.

The electromagnetic interference suppressor of the present invention is preferably set to 0.5 or more in the ratio of actual specific gravity/theoretical specific gravity. In this calculation of the theoretical specific gravity, no solvent is included. The calculation is carried out on the premise that the solvent is completely dried and released. In the case when the ratio of actual specific gravity/theoretical specific gravity is less than 0.5, since a large number of pores are present inside the electromagnetic interference suppressor, the electromagnetic interference suppressing effect is lowered. Here, the actual specific gravity refers to a value to be found by weight/volume of the electromagnetic interference suppressor actually manufactured, and the theoretical specific gravity refers to a value to be found by dividing the total sum of specific gravities contents of the respective constituent components by the volume. In the case when the electromagnetic interference suppressor is made of thin magnetic sheets or the like, the theoretical specific gravity value is in a range from 2.5 to 7.

When air remains therein to cause pores, the electromagnetic interference suppressing effect is lowered drastically; therefore, it is desired to fill soft magnetic powder in high density while the generation of pores is suppressed as little as possible. However, it is difficult to completely discharge the inner residual air, and actually, residual air (voids) is inevitably left in the product depending on the processing step and the shape and the amount of the soft magnetic powder. In other words, generally this state means that the specific gravity is lowered in comparison with a specific gravity (theoretical specific gravity) on the assumption that inherently no air (voids) is present.

Moreover, it is preferable to add 1 to 10% by weight of a dispersing agent to the content of the soft magnetic powder in order to enhance the dispersing property and rust resistance of the soft magnetic powder. With respect to the dispersing agent, for example, a higher fatty acid or a higher fatty acid salt is used alone, or these are used in combination. Here, with respect to the higher fatty acid, for example, palmitic acid, stearic acid, oleic acid, linolic acid, linolenic acid or the like may be used. The number of carbon atoms in the higher fatty acid or the higher fatty acid salt is preferably set to 10 or more. More preferably, this is set to 14 to 20. Any of saturated higher fatty acids and unsaturated higher fatty acids may be used; however, from the viewpoint of stability, saturated higher fatty acids are preferably used. With respect to the higher fatty acid salt, aluminum salts, sodium salts, potassium salts, lithium salts, barium salts, calcium salts, magnetism salts or the like of these higher fatty acids may be used. In the case when these are used in combination, the ratio of higher fatty acid/higher fatty acid salt is preferably set in a range from 20/80 to 80/20 in weight ratio.

In the present invention, among the above-exemplified higher fatty acid metal salts, stearic acid metal salts are preferably used. Specific examples of the stearic acid metal salts include: cadmium stearate, barium stearate, calcium stearate, zinc stearate, lead stearate, tin stearate, aluminum stearate and magnesium stearate.

In the present invention, among the above-exemplified stearic acid metal salts, zinc stearate is preferably used. When the above-mentioned higher fatty acid metal salt is contained, the surface resistivity and flame resistance of the electromagnetic interference suppressor are improved, and the dispersing property and the rust resistance of the soft magnetic metal are improved. Presumably, the reason for these effects is that in the molding process, the higher fatty acid metal salt is dispersed in the electromagnetic interference suppressor in a manner so as to coat the surface of the soft magnetic metal so that, while finely coating the surface of the soft magnetic metal, a complex-state network is formed among other soft magnetic metal atoms.

Preferably, 0.01 to 5% by volume of the above-mentioned higher fatty acid metal salt, more preferably, 0.5 to 4% by volume thereof, is contained in the total volume of the soft magnetic metal. By allowing the soft magnetic metal to contain the higher fatty acid metal salt within this range, the above-mentioned effects can be obtained. In other words, the surface resistivity and the inflammability of the electromagnetic interference suppressor are improved, and the dispersing property and the rust preventing property of the soft magnetic metal are improved. In contrast, when the content is less than 0.01% by volume, the above-mentioned effects might not be obtained, and when the content exceeds 5% by volume, the electromagnetic disturbance suppressing effect of the electromagnetic interference suppressor might be lowered; therefore, these states are not preferable.

The surfaces of the soft magnetic powder and/or the dielectric material (filler) are preferably surface treated. With respect to the surface treatment, generally used treatments using materials, such as a coupling agent and a surface active agent, can be used. Among these, a resin coating method is preferably used, and since this method makes it possible to improve the affinity between the binder and the soft magnetic powder and/or the dielectric material, it becomes possible to fill the soft magnetic powder with high density. With respect to the resin used for surface-coating, the same material as the binder to be used, or an organic polymer material superior in affinity to the binder to be used (such as rubber, thermoplastic elastomer and various plastics) may be used. The amount of the coated resin is preferably set to 0.5 to 10% by weight to the content of the coated soft magnetic powder and the dielectric material.

Figure 14:
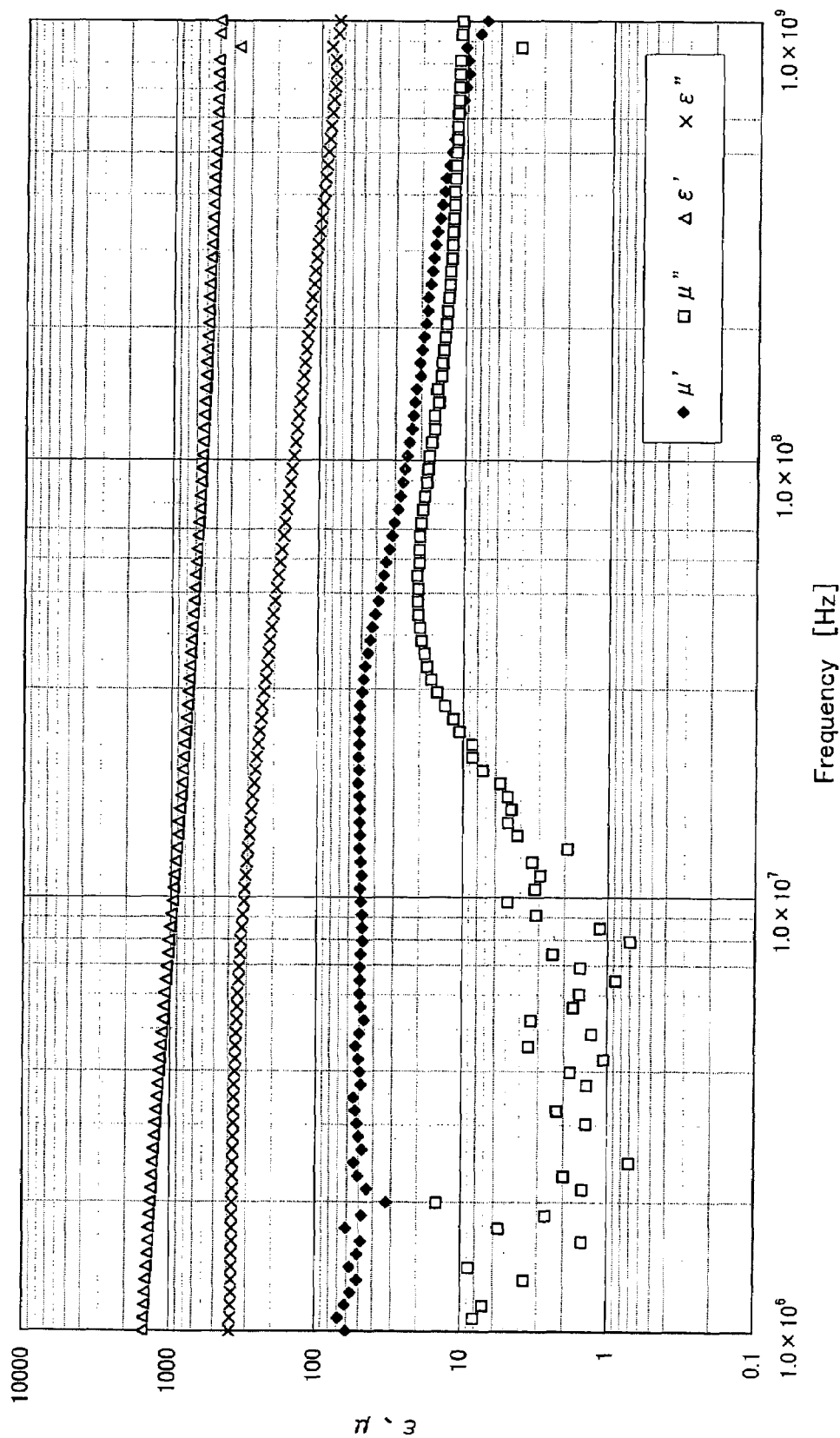
FIG. 14 is a drawing that shows constants of blended materials of Example 12.

The electromagnetic interference suppressor of the present invention has a real part ($\in'$) and an imaginary part ($\in''$) of a complex specific dielectric constant as well as a real part ($\mu'$) and an imaginary part ($\mu''$) of a complex specific magnetic permeability. By adding the soft magnetic powder, the real part $\mu'$ of the complex specific magnetic permeability $\mu$ of the electromagnetic interference suppressor increases. When the soft magnetic powder is highly oriented densely, the imaginary part $\mu''$ of the complex specific magnetic permeability $\mu$ increases, in a frequency range of 50 MHz to 1 GHz. Moreover, since the magnetic resonance frequency can be shifted to a high-frequency side by altering the composition of the soft magnetic metal, it is possible to provide a relationship in which the real part $\mu'$ of a complex specific magnetic permeability $\mu$ is great, while the imaginary part $\mu''$ of a complex specific magnetic permeability $\mu$ is small at 135 KHz as well as at 13.56 MHz. This relationship is suitable for an electromagnetic interference suppressor (magnetic shield sheet, magnetic sheet) to be used for avoiding influences from metals (dielectric members and magnetic materials corresponding to metals) in the vicinity of a loop antenna (coil antenna) to be used for radio communication of the electromagnetic induction type. As the real part $\mu'$ of the complex specific magnetic permeability $\mu$ becomes greater, lines of magnetic force (magnetic flux) come to concentrate on the sheet to pass therethrough, and as the real part $\mu'$ of the complex specific magnetic permeability $\mu$ becomes smaller, the lines of magnetic force (magnetic flux) become difficult to pass through the sheet. Moreover, with respect to the shield layer, as the imaginary part $\mu''$ of the complex specific magnetic permeability $\mu$ becomes greater, more losses are caused in the magnetic field energy, and as the imaginary part $\mu''$ of the complex specific magnetic permeability $\mu$ becomes smaller, the magnetic field energy is made less susceptible to losses. Moreover, by making the soft magnetic metal having a flattened shape aligned and dispersed densely, the electrode plates of a capacitor are made more closely located, and the capacity of the capacitor is consequently made larger so that the real part $\in'$ of an apparent complex specific dielectric constant of the sheet becomes greater. Furthermore, by blending a large amount of the conductive metal, the conductive property of the entire sheet is enhanced, and the imaginary part $\in''$ of a complex specific dielectric constant is also made greater. Here, as shown in FIG. 14, with respect to the real part $\in'$ of a complex specific dielectric constant and the imaginary part $\in''$ of the complex specific dielectric constant, those values are comparatively less frequency dependent and stable. This indicates that values of the real part ∈' of a complex specific dielectric constant and the imaginary part ∈" of the complex specific dielectric constant, obtained at a certain frequency, virtually represent the property of the electromagnetic interference suppressor with respect to all the frequencies.

With respect to the electromagnetic interference suppressor (magnetic shield sheet, magnetic sheet), the real part μ' of a complex specific magnetic permeability μ is set to 30 or more, which is a high level, while the imaginary part μ" of the complex specific magnetic permeability μ is set to 6 or less, which is a low level, with respect to electromagnetic waves of 135 KHz and 13.56 MHz. When indicated as tan δ (=μ"/μ'), this value is also referred to as 0.2 or less. For example, supposing that the real part μ' of a complex specific magnetic permeability μ is 60, the imaginary part μ" of the complex specific magnetic permeability μ becomes 12 when tan δ (=μ"/μ')=0.2 holds. In this case, the limitation of tan δ (=μ"/μ')=0.2 is preferentially applied so that the imaginary part μ" of the complex specific magnetic permeability μ becomes 12 or less. With this arrangement, with respect to magnetic fields formed by electromagnetic waves of 135 KHz or less and 13.56 MHz, the lines of magnetic force (magnetic flux) are allowed to concentrate on the sheet to easily pass therethrough, while the energy of the magnetic field is further made less susceptible to losses. Therefore, by using the electromagnetic interference suppressor (magnetic shield sheet, magnetic sheet), the electromagnetic waves of 135 KHz or less and 13.56 MHz are allowed to transmit without leak, with losses of energy being suppressed to a low level.

Moreover, with respect to the electromagnetic interference suppressor (magnetic shield sheet, magnetic sheet) of the present invention, the real part ∈' of a complex specific magnetic permeability ∈ is set to 30 or more, which is a high level, while the imaginary part ∈" of the complex specific magnetic permeability ∈ is set to 500 or less, which is a low level, with respect to electromagnetic waves of 135 KHz and 13.56 MHz. More specifically, in the case of 13.56 MHz, from the figure of 500 of the imaginary part ∈" of the complex specific magnetic permeability ∈, equations, conductivity σ=0.4 S/m and resistivity ρ=2.5 Ω·m, are obtained, and since the sheet is allowed to have lower conductivity or higher resistivity than these values, this state indicates that no eddy current is generated in the sheet. In the case when the real part ∈' of a complex specific dielectric constant ∈ is great, the resulting feature is that lines of electric force are easily taken in, and together with the feature that lines of magnetic force are easily taken in when the real part μ' of a complex specific magnetic permeability μ is great, these features contribute to cleaner electromagnetic environment.

In the case when, upon carrying out radio communications by utilizing electromagnetic waves of, for example, 135 KHz or less and 13.56 MHz, a metal member (communication disturbing member such as a conductive member and a magnetic material) is located near a loop antenna of a reader/writer (R/W) or a tag, the electromagnetic interference suppressor (magnetic shield sheet, magnetic sheet) of this kind is used and interposed between the loop antenna and the metal member. With this arrangement, leakage of electromagnetic waves of 135 KHz or less and 13.56 MHz toward the metal member side is prevented, and it is possible to prevent energy of electromagnetic waves of 135 KHz or less and 13.56 MHz from attenuating or resonance frequencies from being shifted by an object made of metal. Moreover, magnetic losses in the electromagnetic interference suppressor (magnetic shield sheet) itself can be suppressed to a low level. Therefore, even in the case when a metal member is located near an antenna, radio communication can be desirably carried out by utilizing electromagnetic waves of 135 KHz or less and 13.56 MHz. This effect is obtained in both of the cases of a reader/writer and a tag. The electromagnetic waves of 135 KHz or less and 13.56 MHz are mainly used for communications of, for example, an RFID (Radio Frequency Identification) tag. Therefore, communications are desirably carried out by using the RFID tag.

Moreover, the electromagnetic interference suppressor (noise suppressing sheet) is set to 7 or more in the real part μ' of a complex specific magnetic permeability μ, or to 5 or more in the imaginary part μ" of the complex specific magnetic permeability, with respect to electromagnetic waves having frequencies in a range of 50 MHz to 1 GHz.

Figure 10:
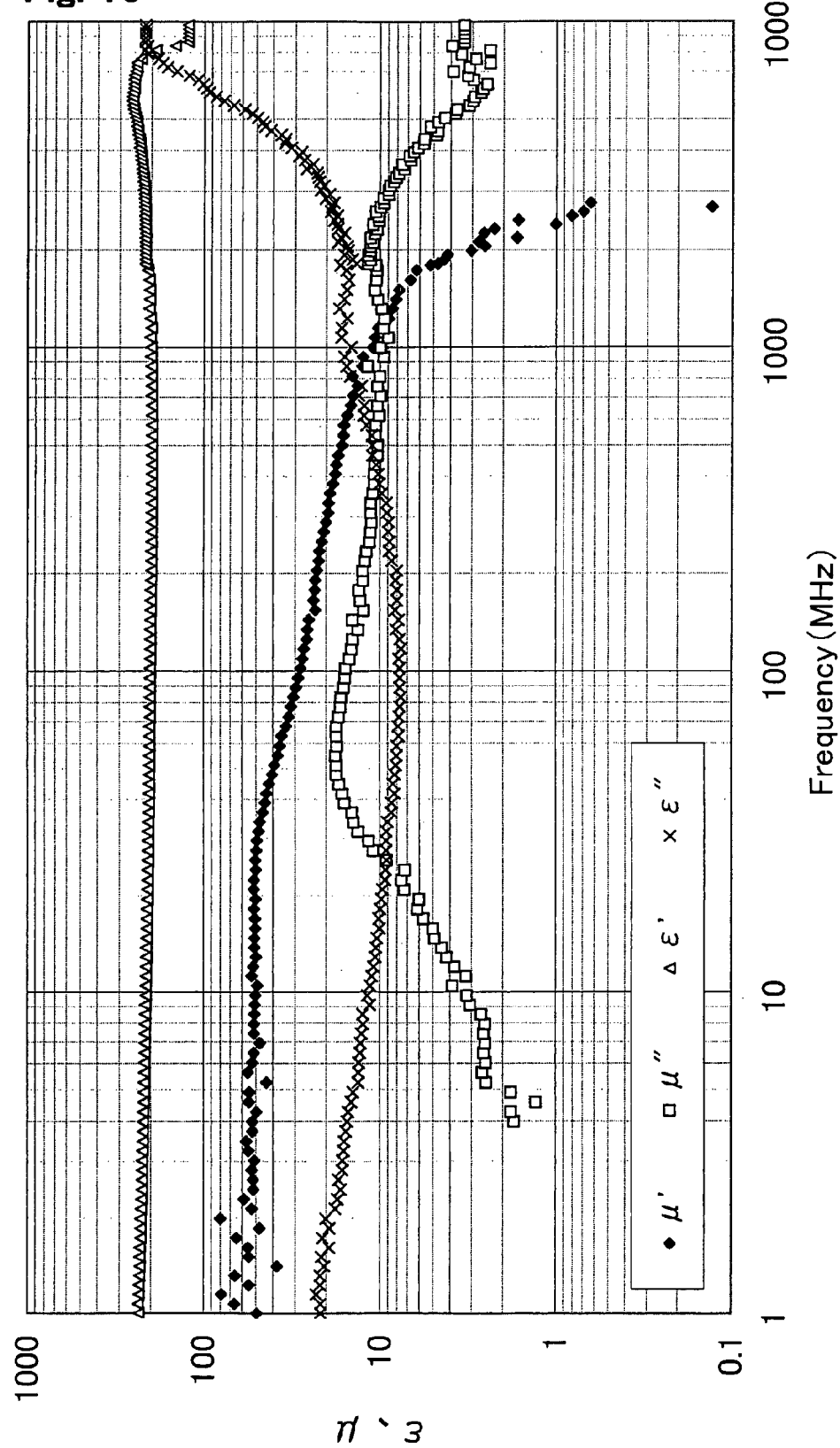
FIG. 10 is a drawing that shows constants of blended materials of Example 11.
Figure 16:
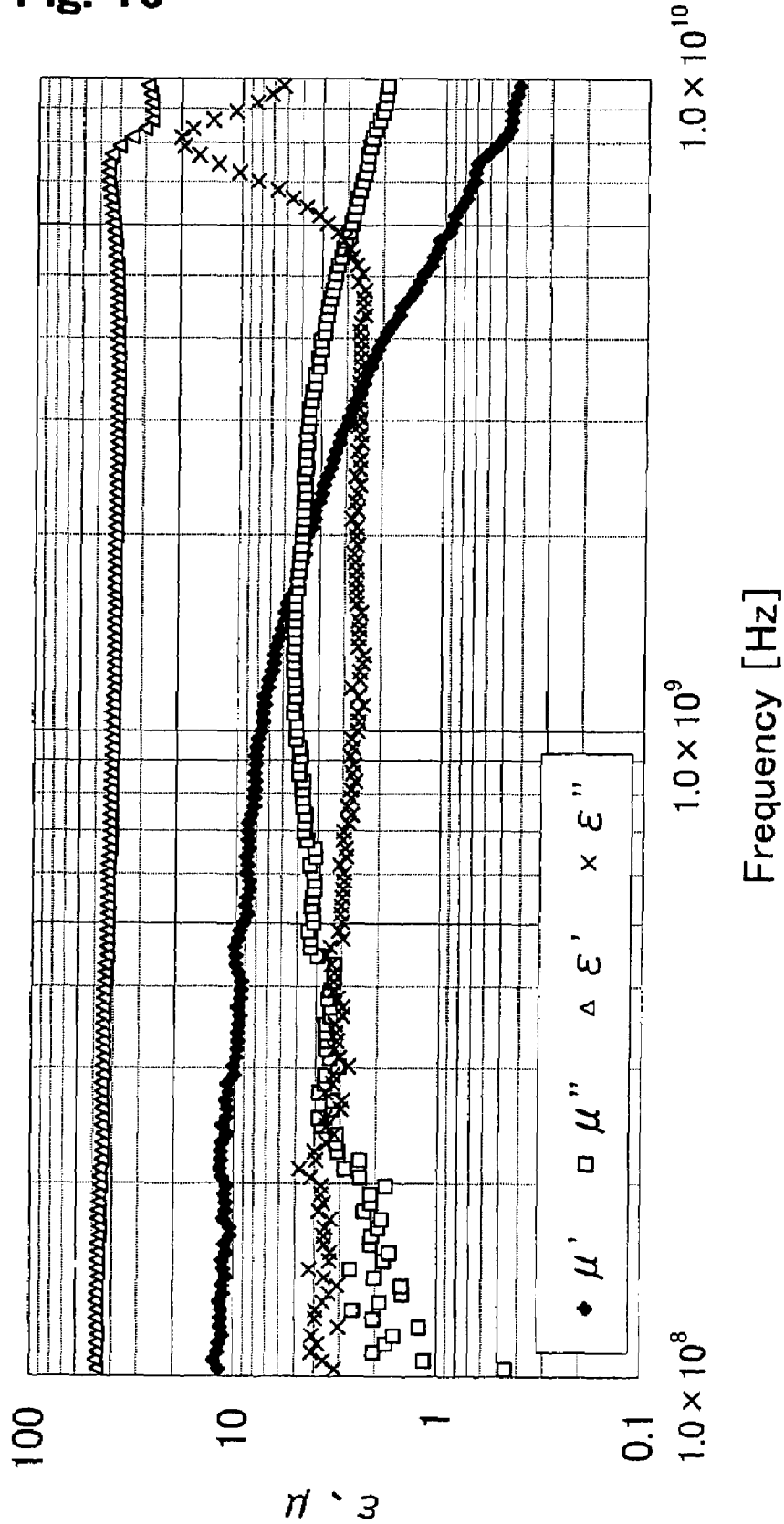
FIG. 16 is a graph that shows material constants in Example 14.

In accordance with the present invention, with respect to electromagnetic waves of 50 MHz to 1 GHz, the electromagnetic interference suppressor (noise suppressing sheet) is set to as small as 7 or more in the real part μ' of a complex specific magnetic permeability μ, or to as high as 5 in the imaginary part μ" of the complex specific magnetic permeability μ. More specifically, with respect to tan δ that indicates the loss of permeability relating to electromagnetic waves in a range of 50 MHz to 1 GHz, for example, as shown in FIGS. 10 and 14, the relationship exceeds 0.3 in each of the frequencies, indicating superior magnetic loss performances. With this arrangement, with respect to magnetic fields formed by electromagnetic waves in a range of 50 MHz to 1 GHz, it is possible to allow lines of magnetic force (magnetic flux) to pass through the sheet to cause losses in the energy of the magnetic field. Therefore, by using the electromagnetic interference suppressor (noise suppressing sheet), it becomes possible to absorb and attenuate electromagnetic waves of 50 MHz to 1 GHz. Therefore, with respect to the electromagnetic waves of 50 MHz to 1 GHz, unnecessary radiation noise or the like can be suppressed. Therefore, with respect to electromagnetic waves of 135 KHz or less and 13.56 MHz to be utilized for communication, losses can be suppressed to a low level, and with respect to unnecessary electromagnetic waves of 50 MHz to 1 GHz, those electromagnetic waves can be absorbed; thus, desirable communications can be carried out. Moreover, the fact that an interference suppressing effect is also exerted on the microwave band exceeding 1 GHz is found, for example, from FIG. 10 and FIG. 16 shown in Examples. FIG. 10 and FIG. 16 indicate that with respect to different frequencies, a single electromagnetic interference suppressor possesses characteristics that can suppress losses to a low level with respect to electromagnetic waves of 135 KHz or less and 13.56 MHz to be utilized for communication, and also absorb unnecessary electromagnetic waves of 50 MHz to 1 GHz; however, achieving both of these features are not indispensable conditions of the present invention, and it is only necessary for the electromagnetic interference suppressor of the present invention to satisfy at least either one of the features.

The magnetic shield sheet of the present invention is provided with a conductive reflection layer and a magnetic layer made of the above-mentioned electromagnetic interference suppressor formed at least one face of this conduction reflection layer, with the magnetic shielding property obtained through the KEC method in a range of 10 MHz to 1 GHz being set to 20 dB or more. Here, the magnetic shield is prepared not for improving the level of radio communication, but for forming a sheet having a property for accurately shielding magnetism. The magnetic field shielding property is preferably measured by the KEC method in which the magnetic leakage toward the periphery of a sample is desirably prevented by devising a sample holder, from the viewpoint of the structure of the measuring device; however, the same effects can be obtained even by the use of an advance method.

Referring to Figures, the following description will discuss the magnetic shield sheet of the present invention. FIGS. 1(a) and 1(b) are cross-sectional views that respectively show one embodiment of the present invention. As shown in FIGS. 1(a) and 1(b), the magnetic shield sheet of the present invention has a structure in which a magnetic material layer 2 is formed on only one of the faces of the conductive reflection layer 1 or magnetic material layers 2 are formed on the two faces thereof. Here, the magnetic layer 2 is the same as the above-mentioned electromagnetic interference suppressor (noise suppressing sheet). The conductive reflection layer 1 is configured by a magnetic metal layer, a magnetic ceramics layer, Fe (iron)-based metal sheet, a Co-based sheet, stainless, or Fe-based metal powder and a binder. With respect to the material of the conductive reflection layer 1, those materials exemplified in the above-mentioned soft magnetic powder may be used. Examples of the Fe-based metal sheet include metal foils of Fe or Fe-based alloys. With respect to the Fe-based alloys, examples thereof include Fe-based alloys containing at least one element selected from the group consisting of Al, Mg, Co, Ni, Mo, B, Si, Sr, Nb and Cr. These materials may be formed into a sheet, or may be vapor deposited. FIGS. 1(c) and 1(d) respectively show structures in which a pasting layer 3 (adhesion agent layer or bonding agent layer) is formed on one face or on each of the two faces of a magnetic shield sheet shown in FIGS. 1(a) and 1(b). Here, in FIGS. 1(b) and 1(d), another structure in which the magnetic layer 2 is used as only one of the faces, with the other face being formed as an insulating layer without magnetic property may be used.

Specific examples of the Fe-based metal sheet and Fe-based metal powder include: SPCC (cold rolled plate and steel strip (JIS G 3141 and JIS G 3313)), SPCD (cold rolled steel plate and band steel (JIS G 3141)), SUY (electromagnetic soft iron), amorphous metal foil, and fused zinc plated steel plate. Regardless of whether or not these materials are subjected to a thermal treatment, those having an initial permeability in a range from 10 or more to 5,000 or less, measured in use, may be adopted. With respect to the commercial products, examples thereof include: Silver Top (SF), Foil Top (made by Toyo Kohan Co., Ltd.) and the like.

These Fe-based metal sheets and Fe-based metal powders preferably have an initial permeability of less than 5,000. In general, those materials having an initial permeability of 5,000 or more are limited to permalloy, Supermalloy or the like, and in particular, the value of the initial permeability is only achieved when an appropriate thermal treatment has been applied thereto. Although the permeability is high, it is unstable, and its magnetic property deteriorates greatly in response to bending and application of a stress. In other words, the high permeability is achieved only at the sacrifice of processability.

In contrast, the magnetic shield sheet of the present invention would rather put more importance onto the processability as long as a predetermined shielding property is ensured. In other words, even when a secondary process, such as punching the magnetic shield sheet and bending it, is carried out, the performances are maintained stably. Moreover, even when an after-cure process for enhancing the permeability is omitted, a predetermined magnetic shielding property is exerted.

Moreover, in the case when the conductive reflection layer 1 is made of Fe or Fe-based alloy powder, Fe or Fe-based alloy powder is mixed with a binder, and this is formed into a sheet. In this case, the amount of Fe or Fe-based alloy powder is preferably set to 20 to 90% by weight, preferably, to 40 to 80% by weight, with respect to the total amount. For example, this is used as a magnetic paint.

The thickness of the conductive reflection layer 1 is preferably set to 500 μm or less, in particular, in a range from 1 μm to 100 μm. With respect to the conductive reflection layer 1, not particularly limited to a plate, foil, paint or the like, for example, a mesh, unwoven fabric or the like, which has been plated, may be used, or those fixed through a method, such as a vapor deposition method, a plating method and an adsorption method, may be used.

With respect to the magnetic shield effect, it is required to have 15 dB in a frequency range of 500 KHz to 1 GHz, when measured by a known method, such as the KEC method or the Advantest method. Preferably, it is set to 20 dB or more. Within this frequency range, a single layer structure of the magnetic layer 2 fails to provide a predetermined magnetic shielding effect (15 dB), and a conductive reflection layer 1 needs to be laminated.

In accordance with the present invention, in the case when the conductive reflection layer 1 is used as a supporting member, by laminating the magnetic layer 2 thereon in a coating process, it is possible to obtain a sheet having an appropriate insulating property, magnetic shielding property and noise suppressing effect. The magnetic layer 2 also has such an effect that it serves as a rust preventive treatment agent for the conductive reflection layer 1. Moreover, the conductive reflection layer 1 may be subjected to a bonding treatment, if necessary.

Preferably, a flame retarder or a flame-retardant auxiliary is added to the electromagnetic interference suppressor of the present invention. With this arrangement, the electromagnetic interference suppressor is allowed to have a flame resistance. For example, an electronic apparatus, such as a mobile telephone, the flame resistance is sometimes required for a polymer material to be used therein.

With respect to the flame retarder used for providing a flame resistance, although not particularly limited, for example, a phosphorous compound, a boron compound, a brominated flame retarder, a zinc-based flame retarder, a nitrogen-based flame retarder, a hydroxide-based flame retarder, metal compound-based flame retarder and the like may be used on demand. With respect to the phosphorous compound, phosphorous acid esters, titanium phosphate and the like are listed. With respect to the boron compound, zinc borate and the like are listed. With respect to the brominated flame retarder, examples thereof include: hexabromobenzene, hexabromocyclodecane, decabromobenzyl phenyl ether, decabromobenzyl phenyl oxide, tetrabromobisphenol and ammonium bromide. With respect to the zinc-based flame retarder, examples thereof include: zinc carbonate, zinc oxide and zinc borate. With respect to the nitrogen-based flame retarder, examples thereof include triazine compounds, hindered amine compounds, and melamine-based compounds such as melamine cyanurate and melamine guanidine compounds. With respect to the hydroxide-based flame retarder, for example, magnesium hydroxide, ammonium hydroxide and the like are listed. With respect to the metal compound-based flame retarder, for example, antimony trioxide, molybdenum oxide, manganese oxide, chromium oxide, iron oxide and the like are listed. With respect to the combinations and amounts of the flame retarder and the flame retarder auxiliary, appropriate combinations and amounts to be used for obtaining a desired flame resistance can be selected, even when RoHS directive subject substances are excluded, it is possible to sufficiently obtain a flame resistance corresponding to UL94V0.

In the present embodiment, with respect to the weight ratio, to 100 of a binder, the following materials at the following ratio were added: 20 of a brominated flame retarder, 10 of antimony trioxide and 14 of phosphorous acid ester; thus, a flame resistance corresponding to V0 in the UL 94 flame resistance test can be obtained. The electromagnetic interference suppressor may use such products as its constituent element, or may be attached to such products, and desirably used. It may be, for example, attached to products to be used in a space or the like in which burning and the subsequent generation of gases should be prevented or suppressed, such as apparatuses inside an air plane, a ship, an automobile and a vehicle, and desirably used.

Figure 2:
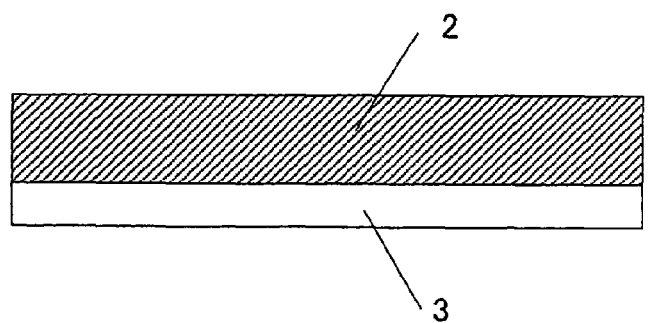

At least one of the surfaces of the electromagnetic interference suppressor has a sticky property or adhesive property. In the present embodiment, a pasting layer (adhesion agent layer or bonding agent layer) is prepared thereon so that as shown in FIGS. 1(c) and 1(d) and FIG. 2, the pasting layer 3 is placed on one face of the electromagnetic interference suppressor 2 in the thickness direction. The electromagnetic interference suppressor 2 can be pasted onto a product through a joining force exerted by the sticky property or the adhesive property of the pasting layer 3. Therefore, the electromagnetic interference suppressor 1 can be easily installed between an antenna element and a metal member, for example, by pasting it to the metal member. The electromagnetic interference suppressor is installed, with one side thereof in the thickness direction being placed on the antenna element side and the other side in the thickness direction being placed on the metal member side. With respect to the pasting member, for example, No. 5000NS made by Nitto Denko Corporation may be used.

The electromagnetic interference suppressor of the present invention is provided with a thermal conductive property. In this case, with respect to the thermal conductive filler, any of those known fillers may be used, or soft magnetic metal powder serving as a magnetic filler may be used as a magnetic and thermal conductive filler.

With respect to the thermal conductive filler, various known fillers may be used. In particular, in the case when a thermal conductive filler is used in combination with soft magnetic powder, the thermal conductive filler is preferably prepared as one kind selected from the group of materials having an electrical insulating property, consisting of boron nitride, aluminum nitride, silicon nitride, aluminum oxide, zinc oxide, silicon oxide, magnesium oxide and ferrite.

With respect to the shape of the thermal conductive filler, although not particularly limited, those having a grain shape with an average particle size in a range from 0.1 to 500 μm, more preferably, from 1 to 200 μm, are preferably used. In order to exert flexibility, the shape close to a spherical shape, such as a grain shape (spherical shape) or a dumbbell shape, is preferably used. Here, the average particle size is measured by using a particle size distribution analyzer (for example, LA-3000 made by Horiba Instruments, Inc.)

In this case, with respect to the thermal conductive filler and the soft magnetic powder, two kinds of the thermal conductive filler and the soft magnetic powder having different average particle sizes at a ratio in a range of 5:1 to 2:1 are preferably mixed with each other. With this arrangement, it becomes possible to increase the amount of filled particles while sufficient flexibility being maintained. In the case when the thermal conductive filler and the soft magnetic powder have elongated shapes, the average particle size refers to an average size of the major diameter. Moreover, the ratio of the sizes of the average particle size or the average major diameter may be applied to mutual magnetic powders, to the relationship between magnetic powder and thermal conductive filler, to mutual thermal conductive fillers, or to all the fillers including a flame retarder. In the present invention, the sizes of the average particle size and the average major diameter are measured values obtained by a particle size distribution measuring device.

The electromagnetic interference suppressor of the present invention is preferably used as a (thin magnetic) sheet having a thickness in a range from 1 μm to 2 mm. In general, in the case of a sheet shape, (flattened) soft magnetic powder is aggregated inside thereof, failing to provide a degree of freedom in the escape path for air and volatile gases of solvents; therefore, voids tend to remain in the sheet. In contrast, the present invention makes it possible to virtually eliminate the residual air in the sheet.

The electromagnetic interference suppressor of the present invention is obtained by the following processes: a magnetic paint containing the (flattened) soft magnetic powder and a binder is applied onto, for example, a supporting member by using a blade or the like, and this is dried, and then separated (pelt) from this supporting member.

Upon preparing the magnetic paint, a solvent is used for dissolving or dispersing the (flattened) soft magnetic powder and the binder. With respect to the solvent, although not particularly limited, examples thereof include: ketones, such as acetone, methyl ethyl ketone (MEK), methyl isobutyl ketone and cyclohexane; alcohols, such as methanol, ethanol, propanol, butanol and isopropyl alcohol; esters, such as methyl acetate, ethyl acetate, propyl acetate, butyl acetate, ethyl lactate and ethylglycol acetate; ethers, such as diethyleneglycol dimethyl ether, 2-ethoxyethanol, tetrahydrofran and dioxane; aromatic hydrocarbon compounds, such as benzene, toluene and xylene; and halogenated hydrocarbon compounds, such as methylene chloride, ethylene chloride, carbon tetrachloride, chloroform and chlorobenzene. Each of these solvents may be used alone, or two or more kinds of these may be used in combination.

With respect to the magnetic paint, the content of the above-mentioned solvent is preferably set to 1000 parts by weight or less, more preferably, in a range from 100 to 800 parts by weight, based on 100 parts by weight of the binder. Here, when the content of the solvent exceeds 1000 parts by weight, this state is not preferable since residual air remains in the sheet.

With respect to the dispersing and kneading devices used for the paint preparation, examples thereof include: a kneader, an agitator, a ball mill, a sound mill, a roll mill, an extruder, a homogenizer, an ultrasonic dispersing machine and a twin-axis planetary kneader. Among these dispersing and mixing devices, in particular, the agitator, ball mill, roll mill, homogenizer, ultrasonic dispersing machine, twin-axis planetary kneader and the like, which give neither damages nor distortions to the (flattened) soft magnetic powder, are preferably used.

With respect to the supporting member, although not particularly limited, for example, paper, a paper laminated with a polymer resin such as polyolefin, a polymer resin, cloth, non-woven cloth, metal and a member subjected to a metallic treatment (vapor deposition, plating, etc.) may be used. Among these, the polymer resin, which is thin and has high strength, is preferably used, and with respect to the polymer resin, examples thereof include: polyesters, such as polyethylene terephthalate and polyethylene-2,6-naphthalene; polyolefins, such as polyethylene and polypropylene; fluororesins in which one portion or the entire portions of hydrogen of these polyolefins is substituted by the fluororesins; cellulose derivatives such as cellulose triacetate and cellulose diacetate; vinyl-based resins such as polyvinyl chloride; vinylidene resins such as polyvinylidene chloride; and polycarbonate, polyphenylene sulfide, polyamideimide and polyimide. Preferably, the surface of the polymer resin is subjected to a peeling treatment by using a parting agent such as silicone resin; thus, the electromagnetic interference suppressor can be desirably separated easily. Moreover, the polymer resin is preferably formed into a film having a thickness in a range from 1 µm to 100 mm.

With respect to the method used for applying a magnetic paint to the supporting member, not particularly limited, for example, any of the following conventional methods may be adopted: air doctor coating, blade coating, wire-bar coating, air-knife coating, squeeze coating, impregnation coating, reverse-roll coating, transfer-roll coating, gravure coating, kiss coating, cast coating, extrusion coating, die coating, spin coating, and the like.

Moreover, upon coating the magnetic paint on the supporting member, or after the coating process thereof, a magnetic field may be applied thereto. With this arrangement, since the resulting electromagnetic interference suppressor has its flattened soft magnetic powder aligned in an inplane direction, it becomes possible to fill the soft magnetic powder with higher density. In order to align the flattened soft magnetic powder in an inplane direction, for example, a permanent magnet is placed above or below the coating face, and a magnetic field is applied in the vertical direction (the thickness direction of the sheet). Although the intensity (magnetic flux density) of the magnetic field differs depending on the kinds of the binder and the flattened soft magnetic powder dissolved or dispersed in the solvent, generally, it is set in a range from 0.01 to 1 (tesla).

End members, which have been cut off so as to form a predetermined shape after the coating process on the supporting member and the succeeding drying process, can be collected, and the supporting member is separated therefrom; thus, for example, by adding these end members to the above-mentioned magnetic paint, they are easily dissolved or dispersed in the paint so that they are easily reused.

Moreover, by adding a crosslinking agent thereto to make the binder crosslinked, the heat resistant property of the electromagnetic interference suppressor may be improved. However, this arrangement makes it difficult to carry out the reusing process.

FIGS. 3(b) and 3(c) are cross-sectional views that schematically show a tag provided with an electromagnetic interference suppressor 7. The tag is one of electronic information transmitting apparatuses that transmit information through radio communications, and, for example, this is used as a transponder for an RF-ID (Radio Frequency Identification) system to be used for automatic identification for a solid matter.

As shown in FIGS. 3(b) and 3(c), the tag is configured by a magnetic-field-type antenna element 4 as shown in FIG. 3(a), an integrated circuit 5 (hereinafter, referred to as "IC chip") serving as a communication means that is electrically connected to the antenna element 4, and carries out a communication process by using the antenna element 4, and the electromagnetic interference suppressor 7 in accordance with the present invention. The tag is designed so that, upon receipt of a request signal from a reader through the antenna element 4, it transmits a signal representing information stored in the IC chip 5 through the antenna element 4. Therefore, the reader is allowed to read the information held in the tag. The tag, which is pasted and attached to, for example, a commercial product, is utilized for theft prevention for the commercial product and for managing the commercial product, such as confirming the state of inventory. An antenna device is configured by containing the antenna element 4 and the electromagnetic interference suppressor 7.

As described above, the antenna element 4, serving as the antenna means, is a loop antenna. The antenna element 4 is achieved by a conductor channel formed on a surface portion on one of the sides in the thickness direction of a substrate 6 made from polyethylene terephthalate (PET) or the like. The IC chip 5 is placed, for example, at one portion of the antenna element 4, and electrically connected thereto. The IC chip 5 is provided with at least a storage unit and a control unit. The storage unit is allowed store information, and the control unit allows the storage unit to store information, and also reads information from the storage unit. In response to a command indicated by an electromagnetic wave signal received by the antenna element 4, the IC chip 5 stores information in the storage unit, and also reads information stored in the storage unit to give the signal representing the information to the antenna element 4. The substrate 6 may have a desired shape, and is formed into, for example, a rectangular shape. The antenna element 4 is normally formed with a predetermined number of windings (for example, 4 to 6 windings), and placed inside the peripheral portion of the substrate 6 (see FIG. 3(a)). The layer thicknesses of the antenna element 4 and the IC chip 5 are set in a range from 1 nm or more to 1000 µm or less, and the layer thickness of the substrate 6 is set in a range from 0.1 µm to 1 mm or less. In this case, by directly printing and processing the antenna element 4 on the electromagnetic interference suppressor 7, a structure without using the substrate 6 may be prepared.

The antenna element 4, the IC chip 5 and the substrate 6 constitute a tag main body. The tag main body is mounted on, for example, an adhesive tape having flexibility, and thus packaged. The tag main body and a sheet member form a tag. Although shown in a simplified manner in FIG. 3(b), the electromagnetic interference suppressor 7 is laminated on the tag main body in a pasted state. Although not shown in FIG. 3(b), by using a adhesion agent layer or an adhesive agent layer between the tag main body (including a structure without the substrate 6) and the electromagnetic interference suppressor 7, or by allowing one of the tag main body and the electromagnetic interference suppressor 7 or both of these to have an adhesive property and a bonding property, both of the members may be pasted to each other in another structure. The tag main body may have a structure in which the surface portion on the side opposite to the side on which the antenna element 4 and the IC chip 5 are placed is allowed to face the electromagnetic interference suppressor 7 so that a layer such as a conductive reflection layer 9 may be coupled to the electromagnetic interference suppressor 7 from the side opposite to the electric wave transmitting and receiving side. Although not particularly limited, the coupling structure between the electromagnetic interference suppressor 7 and the tag main body may be formed by using a binding agent containing an adhesion agent and a bonding agent. FIGS. 3(b) and 3(c) show a state in which the structure used for coupling the electromagnetic interference suppressor 7 and the tag main body is omitted. The tag has a laminated structure in which, from one side to the other side in the thickness direction, the layers of the antenna element 4 and the IC chip 5, the layer of the substrate 6, the electromagnetic interference suppressor 7, the binding layer, the conductive reflection layer 9 and the pasting layer are stacked in this order. The electromagnetic interference suppressor 7 and the substrate 6 are formed into the same shape (for example, a rectangular shape). Here, the electromagnetic interference suppressor 7 and the substrate 6 are not necessarily formed into the same shape. The conductive reflection layer 9 is not an essential component, and metal, closely located, may be used for this purpose.

The antenna element 4 transmits an electromagnetic wave signal in a direction crossing an expanding direction of the antenna element 4, and is allowed to receive an electromagnetic wave signal arriving in a direction crossing the expanding direction of the antenna element 4. In the present embodiment, based upon the antenna element 4, an electromagnetic signal is transmitted in a transmitting and receiving direction A that is led to the side opposite to the substrate 6 and the electromagnetic interference suppressor 7, and an electromagnetic signal arriving from the transmitting and receiving direction A can be received.

In the tag, when an electromagnetic wave signal representing predetermined information to be stored (hereinafter, referred to as "main information") and information (hereinafter, referred to as "storage instructing information") used for instructing the main information to be stored, sent from an information managing device serving, for example, as a reader, is received by the antenna 4, an electric signal representing the main information and the storage instructing information is given from the antenna element 4 to the IC chip 5. In the IC tag, the control unit stores the main information in the storage unit based upon the storage instructing information.

Moreover, when an electromagnetic wave signal representing information representing information (hereinafter, referred to as "transmission instructing information") used for instructing information to be stored in the storage unit (hereinafter, referred to as "storage information"), sent from the information managing device, is received by the antenna 4, an electric signal representing the transmission instructing information is given from the antenna element 4 to the IC chip 5. In the IC tag, the control unit reads information (storage information) stored in the storage unit based upon the transmission instructing information, and gives an electric signal representing the storage information to the antenna element 4. Thus, an electromagnetic wave signal representing the storage information is transmitted from the antenna element 4.

In this manner, the tag serves as an electronic information transmitting device that transmits and receives an electromagnetic wave signal through the antenna 4. The tag may be a battery-driven tag to be driven by a battery installed therein, or a battery-less tag that returns an electromagnetic wave signal by utilizing energy of the received electromagnetic signal.

In order to allow the tag of this kind to be used in the vicinity of a metal face and a magnetic material face that form communication disturbing members, the electromagnetic interference suppressor 7 is attached thereto. The electromagnetic interference suppressor 7 is installed on the side opposite to the transmitting and receiving direction "A" with respect to the antenna element 4. The electromagnetic interference suppressor 7 is pasted onto a communication disturbing member 8 such as metal to be used, by using a pasting agent layer. The tag is arranged so that the electromagnetic interference suppressor 7 is placed closer to the communication disturbing member 8 than to the antenna element 4; thus, the electromagnetic interference suppressor 7 is interposed between the antenna element 4 and the communication disturbing member 8. The electromagnetic interference suppressor 7 is not necessarily required to have the same shape as the antenna 4, and may be formed into, for example, a similar shape to the antenna element with a void formed therein or another shape with a slit or a hole opened therein.

Figure 4:
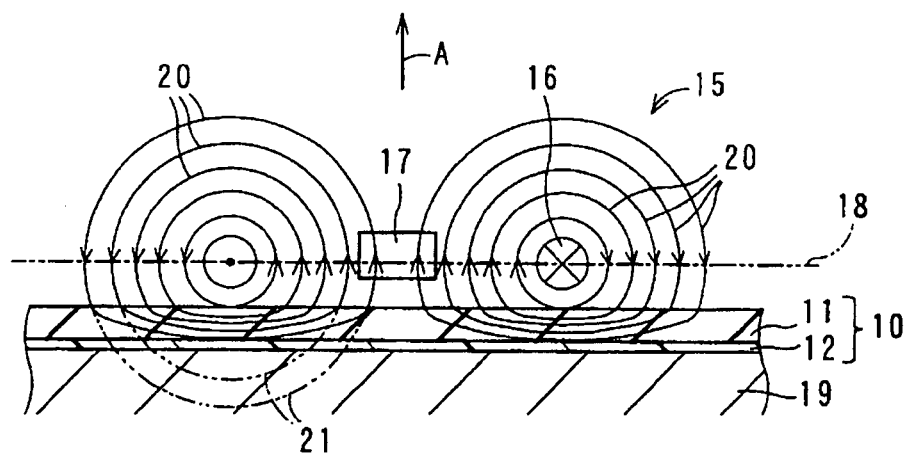
FIG. 4 is a drawing that exemplifies a magnetic field exerted by electromagnetic waves transmitted and received from an antenna element.

With an electromagnetic field being concentrated and allowed to pass, as shown in FIG. 4, of two areas separated by an electromagnetic interference suppressor 11, an electromagnetic field of one of the areas is prevented from leaking to the other area, and energy of the one of the areas is prevented from transmitting to the other area, by using the electromagnetic interference suppressor 11. The electromagnetic field that can be blocked of course includes an electromagnetic field formed by electromagnetic waves, and consequently, the electromagnetic waves that form this electromagnetic field can also be blocked. FIG. 4 shows, for example, a magnetic field formed by electromagnetic waves that are transmitted and received by an antenna element 16.

More specifically, the electromagnetic interference suppressor 11 is made from a material having a great real part $\mu'$ of a complex specific magnetic permeability $\mu$; therefore, when the electromagnetic interference suppressor 11 is placed in a magnetic field, lines of magnetic force 20 concentrate on the electromagnetic interference suppressor 11 to pass therethrough, as shown in FIG. 4, with the result that they are not allowed to pass through the communication disturbing member 19 (for example, metal) closely located thereto, or hardly allowed to pass therethrough. With this arrangement, by using the electromagnetic interference suppressor 11, the magnetic field is shielded so that the magnetic field of the area in which the antenna element 16 is placed, that is, one of areas separated by the electromagnetic interference suppressor 11, is prevented from leaking to the area in which the metal member 19 is placed, that is, to the other area.

In the case when the antenna element 16 is placed at the same position as shown in FIG. 4, if no electromagnetic interference suppressor 11 is installed, lines of magnetic force by the transmitted electromagnetic waves will pass through the inside of the communication disturbing member 19 made of metal or the like, for example, as indicated by a hypothetical line 21 shown in FIG. 4. When the lines of magnetic force pass through the inside of the communication disturbing member 19, an eddy current is generated in the communication disturbing member 19 due to changes in the magnetic field, thereby generating heat. In this manner, the energy of the magnetic field is converted into thermal energy so that the energy of the magnetic field is absorbed. Moreover, since the eddy current generates a magnetic field in a direction reversed to that of the tag magnetic field to cause such an adverse effect that the magnetic field is attenuated. Moreover, due to changes in impedance of the antenna element 16, the resonance frequency is shifted (see FIG. 13) to cause another problem of communication failure due to a difference in the communication frequency that has been designed under the free space.

In contrast, by allowing the magnetic field to concentrate and pass therethrough by the use of the electromagnetic interference suppressor 11, it is possible to prevent the energy of the magnetic field on the side opposite to the communication disturbing member 19 with respect to the electromagnetic interference suppressor 11 from being absorbed and attenuated by the communication disturbing member 19. Consequently, on the antenna 16 side that is the side opposite to the communication disturbing member 19 with respect to the electromagnetic interference suppressor 11, it becomes possible to prevent the energy of the magnetic field formed by electromagnetic waves transmitted and received by the antenna element 16 from being absorbed and attenuated by the communication disturbing member 19.

Moreover, the electromagnetic interference suppressor 11 is composed of a material having a small imaginary part of a complex specific magnetic permeability; therefore, even when magnetic fluxes pass through the inside of the electromagnetic interference suppressor 11, it is possible to reduce the energy loss due to the passage through the electromagnetic interference suppressor 11 to a small level. Thus, even when the lines of magnetic force are allowed to concentrate on and pass through the electromagnetic interference suppressor 11, it becomes possible to suppress the electromagnetic interference suppressor 11 from causing an energy loss of the magnetic field. In this manner, the electromagnetic interference suppressor 11 makes it possible to prevent the energy of the magnetic field from being absorbed by the communication disturbing member 19 located closely thereto, and also to reduce the loss caused by itself, and minimize the attenuation of the energy of the magnetic field to as small a level as possible.

Moreover, for example, as shown in FIG. 13, the present invention also has a function for correcting the resonance frequency of the antenna element 16 that has been shifted by the influences of a communication disturbing member 43. More specifically, the resonance frequency that has been shifted toward the high frequency side due to the influences of the communication disturbing member 19 (metal or the like) located closely to the antenna element 16 can be returned to the communication frequency of the free space by the presence of the electromagnetic interference suppressor 11 (that is, shape, thickness, $\mu'$, $\mu''$, $\in'$, $\in''$). Here, with respect to this function, in general, the adjustment is carried out with a matching circuit being attached thereto so as to accurately adjust the frequency. Moreover, in order to eliminate the time-consuming tasks of matching the frequency, the antenna element 16, the electromagnetic interference suppressor 11 and the conductive reflection layer (not shown) are laminated so that an electronic information transmitting device such as a tag in which the resonance frequency has been matched is prepared. Here, in FIG. 4, reference numeral 12 represents a pasting layer, 17 represents an IC chip, reference numeral 18 represents a line that shows the center line of the cross section of the antenna element 16, and arrow A represents a transmitting and receiving direction of an electromagnetic signal, respectively.

In this manner, the electromagnetic interference suppressor 11 is interposed between the antenna element 16 and the communication disturbing member 19 made of metal (including a material having a conductive property) so that the energy of an electromagnetic field caused by an electromagnetic wave transmitted and received by the antenna element 16 is prevented from being absorbed and attenuated by the communication disturbing member 19. The electromagnetic interference suppressor 11, used for preventing the influences of the communication disturbing member 19, is also reduced to a small level in the magnetic loss and dielectric loss. Therefore, transmitting and receiving operations even in a long distance can be carried out desirably by the antenna element 16. Therefore, even in the case when the tag 15 is attached closely to the communication disturbing member 19, information radio communications are available between the information managing device and the tag 15 so that information represented by an electromagnetic wave signal transmitted from the information managing device can be stored in the tag 15, and information stored in the tag 15 can also be read out by the information managing device.

Figure 5:
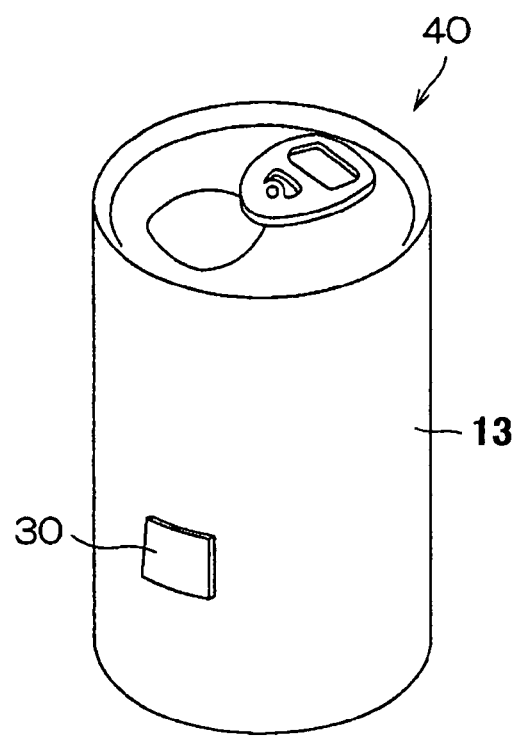
FIG. 5 is a drawing that shows an example of an application of the tag formed by using the electromagnetic interference suppressor of the present invention.
Figure 6:
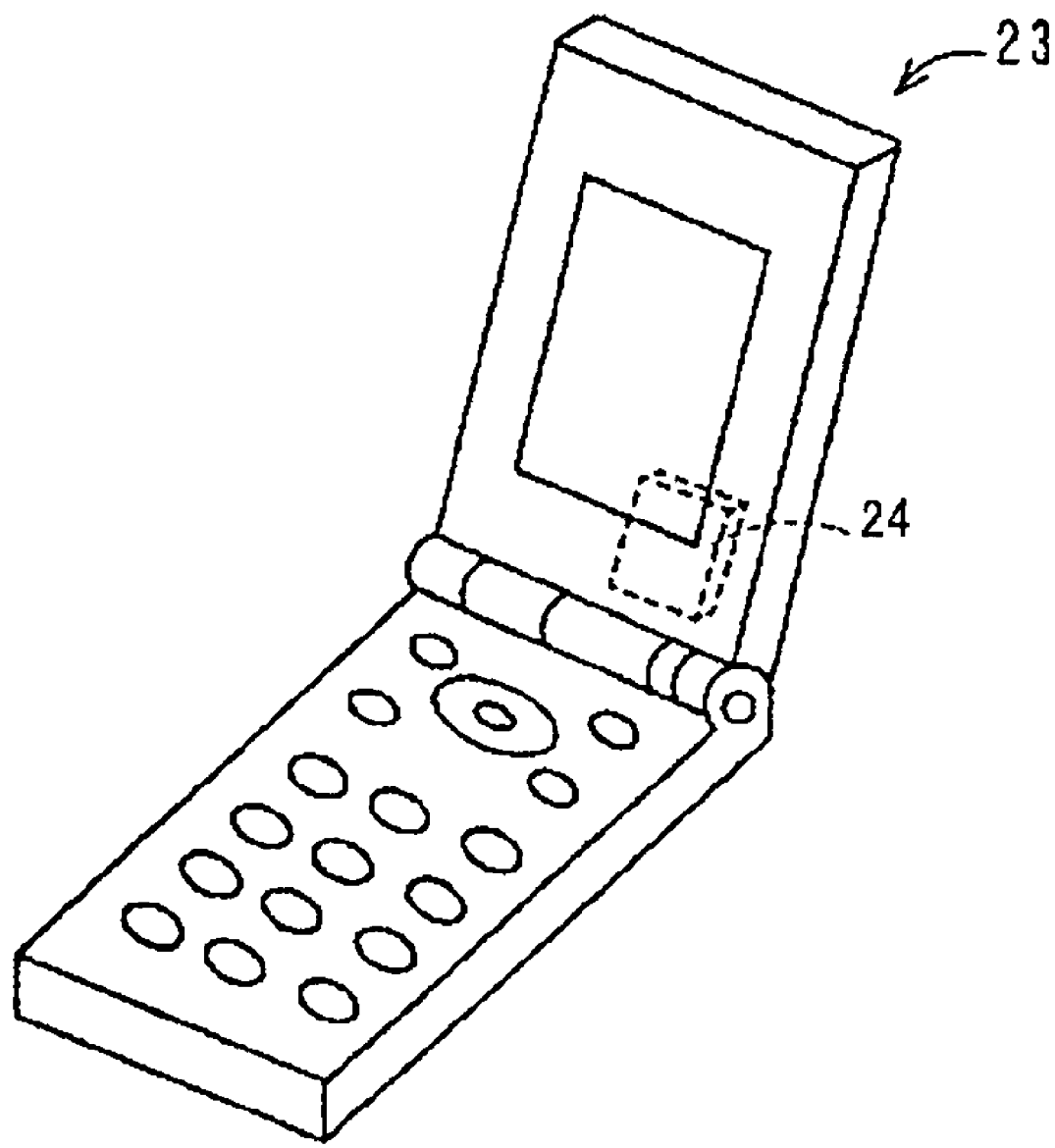
FIG. 6 is a drawing that shows another example of an application of the tag formed by using the electromagnetic interference suppressor of the present invention.

In this manner, by using the electromagnetic interference suppressor 7, the tag using the antenna element 4 is, for example, pasted to the communication disturbing member 8 so as to be placed closely to the communication disturbing member 8; thus, the tag can be used in a state capable of achieving desirable transmitting and receiving operations of an electromagnetic wave signal. Therefore, for example, as shown in FIG. 5, a tag 30 may be pasted to a beverage product 40 housing a beverage in a metal container 13 that is a communication disturbing member so as to be used for merchandize management and the like. Moreover, for example, as shown in FIG. 6, a tag 24 may be installed in an electronic apparatus 23 such as a mobile telephone apparatus in which a number of communication disturbing members, such as substrates, are used so that the tag can be used for, for example, merchandise management or for the purpose of preventing theft or the like. In this manner, it is possible to ensure a wider range of applications for the tag, and consequently to achieve a highly convenient tag.

Moreover, with respect to the applications of the electromagnetic interference suppressor of the present invention, not limited to the tag, it may be applied to electronic information transmitting apparatuses other than the tag, or the electromagnetic interference suppressor may be formed into an antenna device in combination with an antenna element. With respect to electronic information transmitting apparatuses other than the tag, examples thereof include an antenna that forms an RF-ID system together with a tag, a reader, a reader/writer, a mobile telephone apparatus, a PDA and a personal computer; and in addition to these, other examples include a theft preventive apparatus, a communication apparatus used for remote-controlling robots and the like, a vehicle-use ECU and all other antenna functional parts to which the radio technology using electric waves is applied. The frequency is not limited to the radio wave band, as described earlier. Moreover, the applications of the electromagnetic interference suppressor are not limited to electronic information transmitting apparatuses, and may be applied to a wider range in which at least a magnetic field needs to be shielded. Here, the tag may be an article having a communication disturbing member other than the above-mentioned articles. With respect to the tag, the above-mentioned basic components are molded or packaged into an appropriate form to be used.

Figure 3:
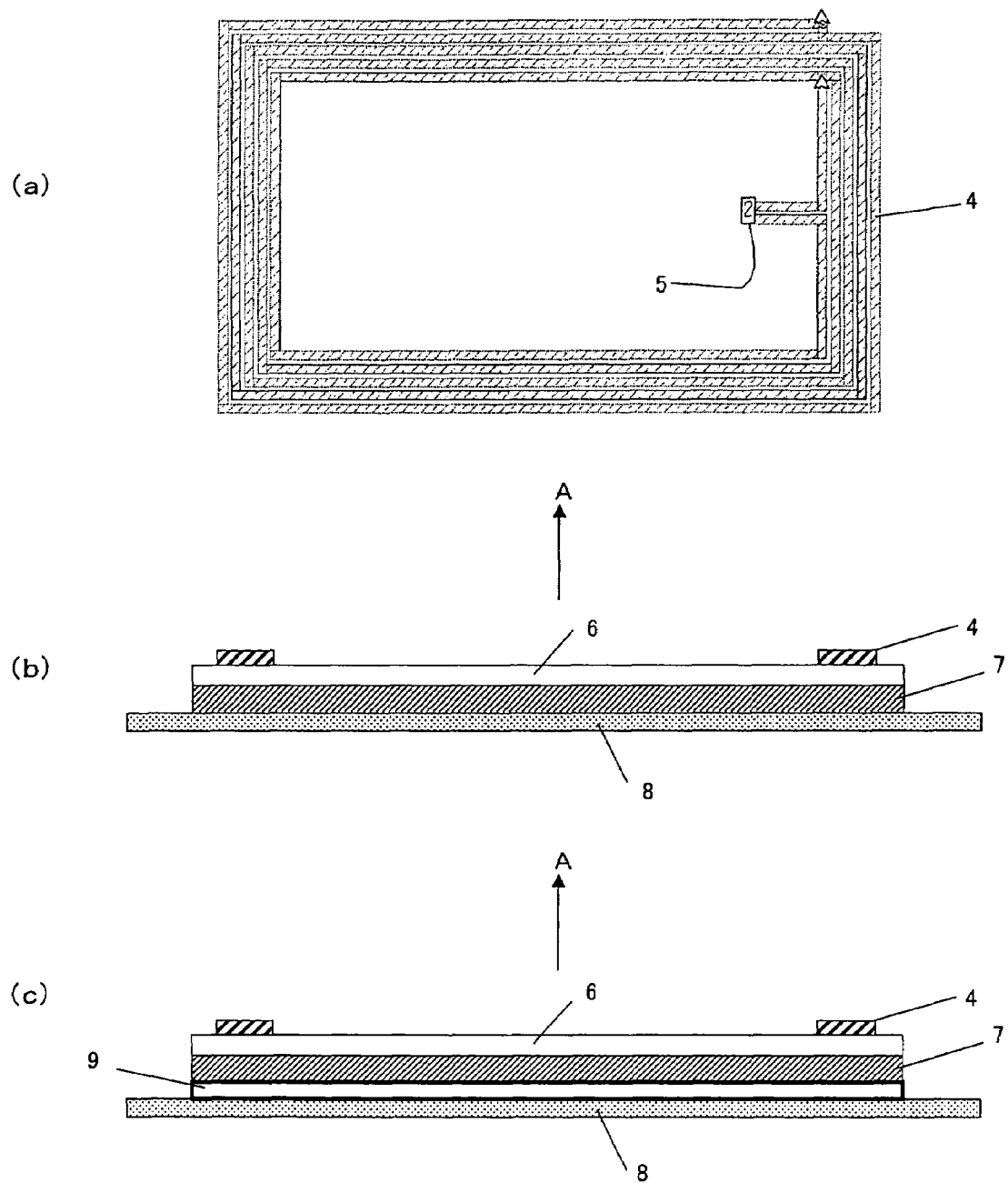
FIG. 3(a) is a drawing that shows a layout of a loop (coil) antenna and an IC chip.
FIG. 3(b) is a cross-sectional view that shows one example of a tag construction in which electromagnetic suppressing members are laminated.
FIG. 3(c) is a cross-sectional view that shows another example of a tag construction in which electromagnetic suppressing members are laminated.

In the case when a conductive reflection layer is laminated on the electromagnetic interference suppressor (for example, FIG. 3($c$)), by adjusting (matching) the resonance frequency of an antenna, the antenna is allowed to exert its functions even when radio communications are conducted near any communication disturbing member 8 (member having a portion made from a conductive material). The adjusting (matching) process for the resonance frequency of the antenna can be carried out by using a known method, such as an impedance adjusting (matching) process by the use of an attached capacitor.

The electromagnetic interference suppressor of the present invention is applied to various electronic apparatuses, such as domestic electric appliances such as televisions, computers such as personal computers, mobile communication apparatuses such as mobile telephones and medical equipment, and it can suppress unnecessary electromagnetic waves released from these electronic apparatuses from giving influences to other electronic apparatuses, electronic parts, circuit substrates, etc., to cause malfunction. More specifically, by installing it in the electronic equipment or on the periphery thereof, it becomes possible to effectively suppress electromagnetic interference caused by interference of unnecessary electromagnetic waves. For this purpose, with respect to the application modes of the electromagnetic interference suppressor, for example, a sheet-state electromagnetic interference suppressor is appropriately cut out, and this is pasted to the vicinity of a noise source of the equipment, or the corresponding paint-state material is applied to a noise source or the vicinity thereof in the equipment to form an electromagnetic interference suppressor.

In order to improve radio communications using a frequency of 13.56 MHz in a mobile terminal having an IC tag function that is referred to as RF-ID (Radio Frequency Identification), the electromagnetic interference suppressor is used for reducing influences from metal located closely thereto, and in this case, the electromagnetic interference suppressor is interposed between a conductive face and a loop antenna. The applications thereof include: non-contact charging for watches, etc., key-less entry for automobiles and the like, FeliCa applicable equipment, IC cards, tags, ATS apparatus for use in speed-reduction means for trains, magnetic shield corresponding to low frequencies (10 MHz or less), magnetic shield box used for suppressing noise against radio voice, ECU, magnetic noise shielding means for blast furnace, and further include: flame retarder compositions for various electric-wave absorbing members used for radio communication for GHz band, radio LAN and ETC, and inorganic fillers (having a flattened shape or another shape, with or without a soft magnetic property) as well as pressure sensors, dielectric sensors magnetic sensors, heat radiating materials and the like in which a large amount of the filler is used.

Hereinafter, the electromagnetic interference suppressor of the present invention will be explained in detail by means of Examples and Comparative Examples; however, the present invention is not intended to be limited only by the following Examples.

The materials used in the following Examples and Comparative Examples are explained as follows: With respect to the resin used as a binder, except for polyurethane resin having a glass transition temperature of −3° C. and a softening point of 39° C., all the resins have a storage modulus (E') of $10^7$ Pa or more at room temperature. In the case of using this material (that is polyurethane resin having a glass transition temperature of −3° C. and a softening point of 39° C.), the blending process is carried out at such a blending ratio that the polyurethane resin having a high storage modulus (E') becomes rich, that is, the sea portion of the sea and island structure is formed by the polyurethane resin having a high storage modulus (E'); thus, provision is made so that the storage modulus (E') as the binder is set to $10^7$ Pa or more at room temperature.

Figure 7:
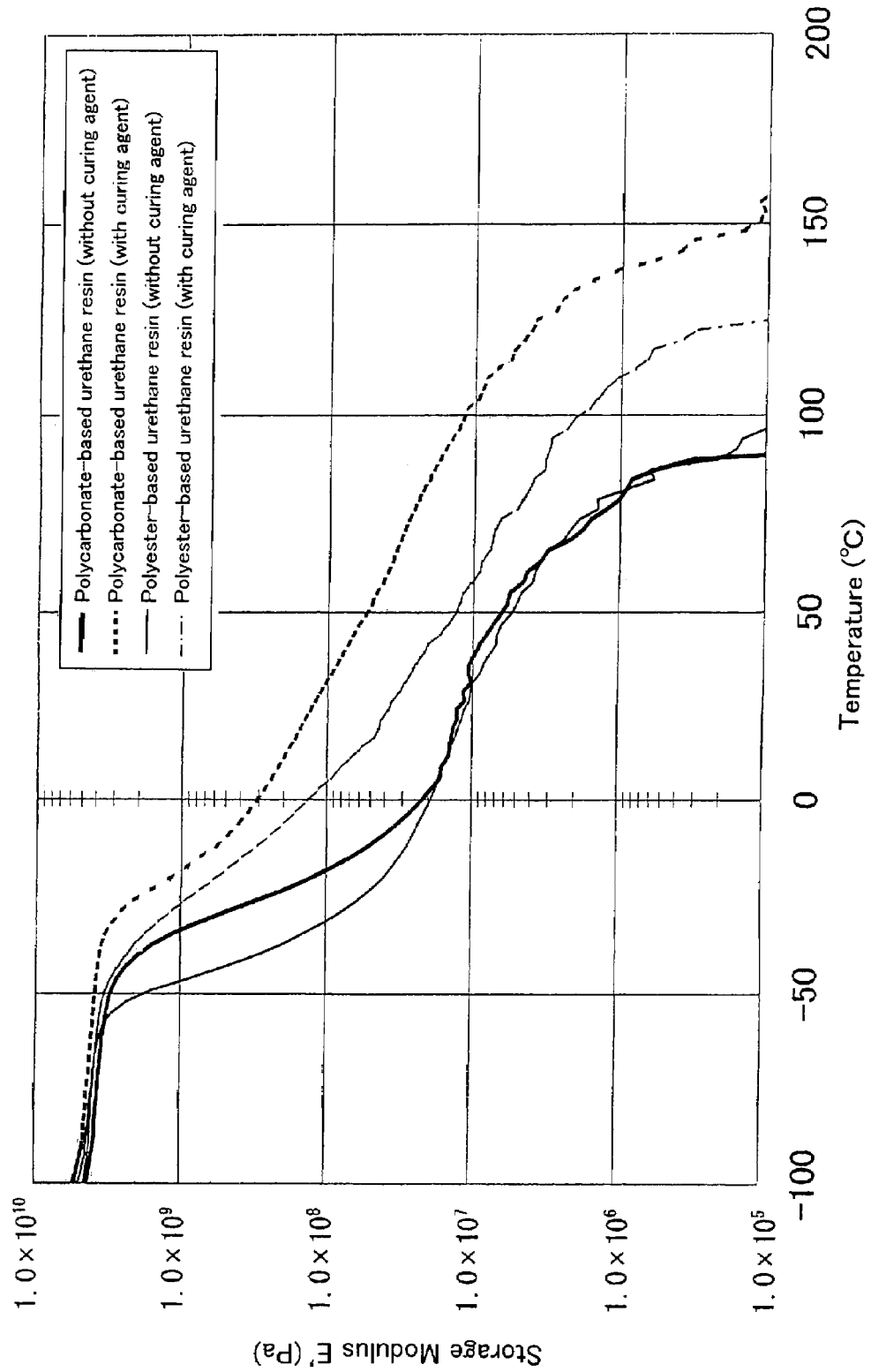
FIG. 7 is a drawing that shows the results of measurements on storage modulus (E') of resin.
Figure 8:
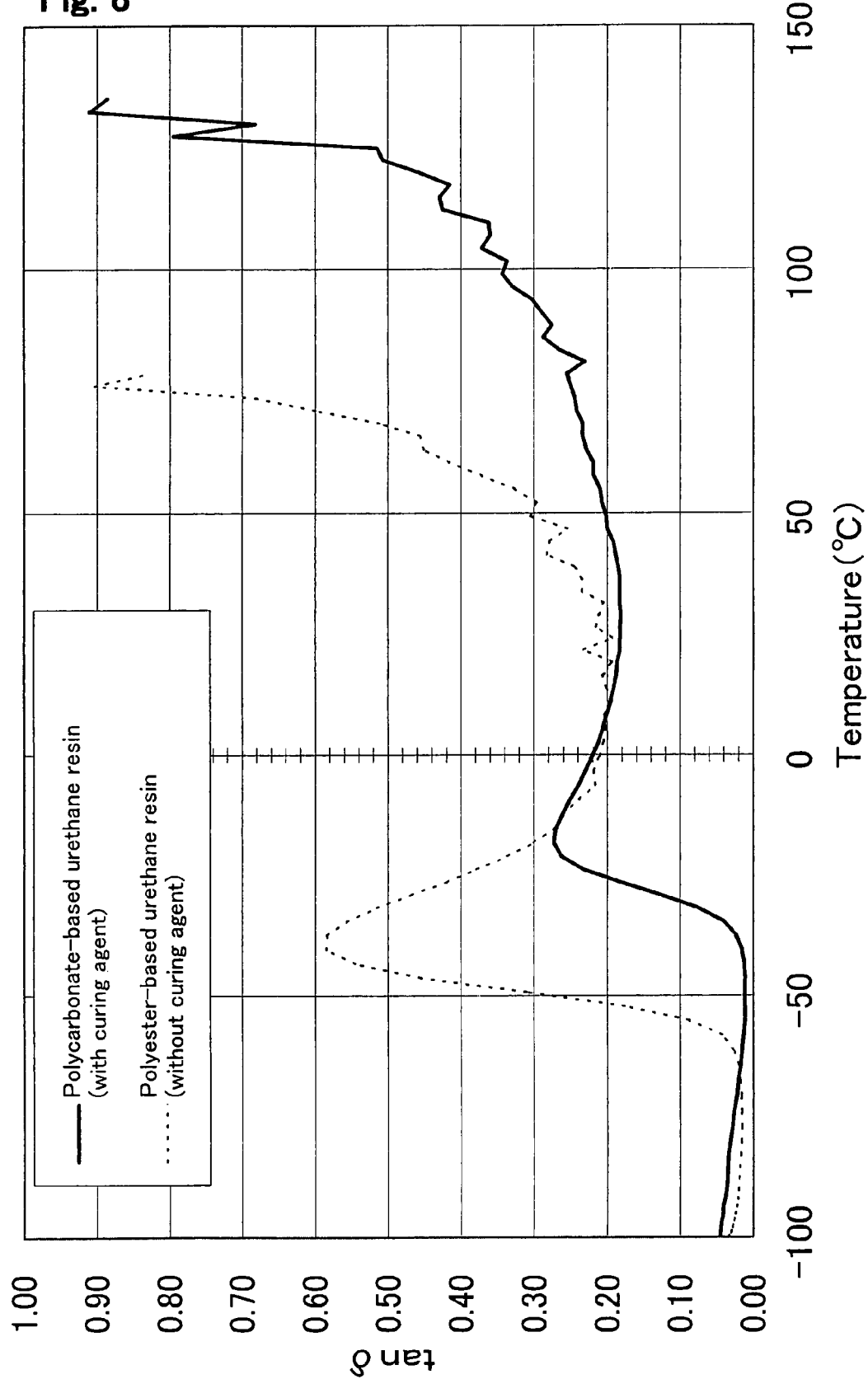
FIG. 8 is a drawing that shows the results of measurements on tan δ of the resin.

The storage modulus (E') is measured by a DMA (dynamic viscoelasticity measuring apparatus) made by Seiko Instruments Inc. With respect to the resins used in Examples, the results of measurements on the storage modulus (E') are shown in FIG. 7. The results of measurements on tan δ obtained by the same apparatus are shown in FIG. 8. The glass transition point is determined based upon the peak temperature of tan δ, and the softening point is determined based upon a changing point at which the flat area of the storage modulus (E') near room temperature comes to exhibit a softening property at a high temperature portion.

The solvent used for forming a coating solution is a mixed solvent mainly composed of toluene.

Polyvinyl acetal resin: Eslec made by Sekisui Chemical Co., Ltd.
Polyester urethane resin: Vylon made by Toyobo Co., Ltd.
Polyurethane elastomer: Nipporan made by Nippon Polyurethane Industry Co., Ltd.
Polyester-based urethane resin: Nipporan made by Nippon Polyurethane Industry Co., Ltd.
Polycarbonate-based urethane resin: Nipporan made by Nippon Polyurethane Industry Co., Ltd.
Flattened Fe—Ni—Cr—Si: JEM powder made by Mitsubishi Material Corporation
Stearic acid: Stearic acid made by NOF Corporation
Barium stearate: NS—B made by Namariichi Co., Ltd.
Zinc stearate: Zinc stearate made by NOF Corporation

EXAMPLES 1 TO 7 AND COMPARATIVE EXAMPLES 1 AND 2

<Production of Electromagnetic Interference Suppressor Sheet>

A magnetic paint was formed by using a composition shown in Table 1, and the paint was applied to PET (polyethylene terephthalate, a peeling support member) by using a doctor blade method, and this was left in a room at 25° C. to be subjected to a room temperature drying process; thus, a sheet was formed. Next, the peeling support member was separated so that electromagnetic interference suppressor sheets having thicknesses of 60 μm and 100 μm respectively, which relate to the present invention, were obtained. With respect to the electromagnetic interference suppressor sheets, the ratio of actual specific gravity/theoretical specific gravity and transmission losses at 1 GHz and 2 GHz were respectively measured. The results are shown in Table 1.

Here, in Table 1, the blending amounts of the respective components are indicated by parts by weight. In this case, the flattened soft magnetic powder was 40% by volume and the binder was 56% by volume. Here, the volumes of the flattened soft magnetic powder and the binder were found from the specific gravities and the blending weights of these materials. At the time of measuring, the room temperature was 25° C.

<Measuring Method of Transmission Loss>

Figure 9:
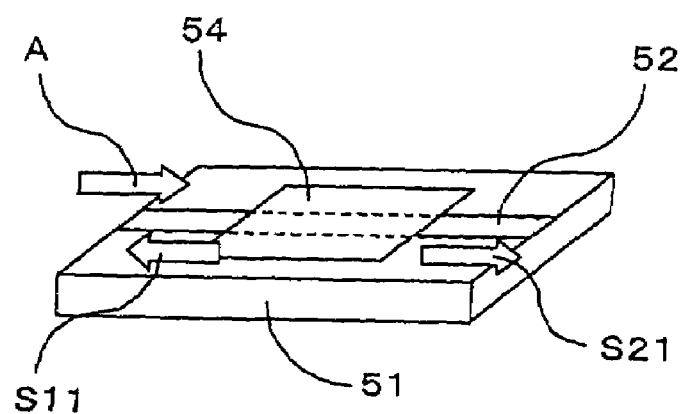
FIG. 9 is a schematic drawing that shows a shape of a microstrip line used for measurements on transmission loss in an Example.

The transmission loss was measured by using a micro strip line having an impedance Z=50 Ω. The micro strip line channel is a transmission loss measuring method for neighborhood noise, which has been widely used because of its structure suitable for packaging surface mount parts and easiness for production. FIG. 9 shows a shape of a micro strip line used in this method. This has a structure in which a linear conductor path 52 is formed on the surface of an insulator substrate 51, with an electromagnetic interference suppressor 54 being mounted on the conductor path 52. The two ends of the conductor path 52 are connected to a network analyzer (not shown). Here, with respect to an incident wave indicated by arrow A, the amount of reflection (dB) (indicated by arrow S11) from the mount position of the electromagnetic interference suppressor 54 and the amount of transmission (dB) (indicated by arrow S21) were measured, and a difference between these was obtained as an amount of loss so that the transmission loss (amount of absorption) was found from the following equation:

$$\text{Transmission loss(amount of absorption)}=1-|S11|^2-|S21|^2 \quad \text{[Equation 3]}$$

The transmission loss of the micro strip line becomes higher as the thickness of the electromagnetic interference suppressor 54 becomes thicker. In general, the electromagnetic interference suppressor 54 having a high transmission loss with a thin thickness is desirably used.

EXAMPLES 8 AND 9

A magnetic paint was formed by using a composition shown in Table 1, and electromagnetic interference suppressor sheets of the present invention having thicknesses of 60 μm and 100 μm respectively were obtained in the same manner as Examples 1 to 7, except that, upon carrying out the coating process and the drying process on the PET (peeling support member) by using a doctor blade method, a permanent magnet was placed above the coated surface, with a magnetic field [intensity of the magnetic field (density of magnetic fluxes): 0.1 (tesla)] being applied thereto in a perpendicular direction. With respect to the electromagnetic interference suppressor sheets thus obtained, the ratio of actual specific gravity/theoretical specific gravity and transmission losses at 1 GHz and 2 GHz were respectively measured in the same manner as Examples 1 to 7. The results are shown in Table 1.

EXAMPLE 10

<Resin Coating of Flattened Soft Magnetic Powder>

Flattened Fe—Ni—Cr—Si was subjected to a surface treatment by using an epoxy-based thermosetting resin made by Resinous Chemical Co., Ltd. The amount of resin coat was 4% by weight with respect to the content of the flattened soft magnetic powder (that is, weight ratio of flattened magnetic powder: resin=100:4). Moreover, this was subjected to a heating treatment at 150° C. for 30 minutes as a post treatment so that coated resin was thermally cured.

The resins used for the surface treatment were shown below, and the surface of the flattened Fe—Ni—Cr—Si was resin-coated with the material that the main agent and the curing agent were mixed at a ratio of 10 to 1.

Main agent: A-7516 (made by Resinous Chemical Co., Ltd.)

Curing agent: H-7610 (made by Resinous Chemical Co., Ltd.)

<Production of Electromagnetic Interference Suppressor Sheet>

The electromagnetic interference suppressor sheets of the present invention having thicknesses of 60 μm and 100 μm respectively were obtained in the same manner as Examples 1 to 7, except that a magnetic paint was formed with a composition as shown in Table 1 by using the flattened soft magnetic powder surface-treated as described above. With respect to the electromagnetic interference suppressor sheets thus obtained, the ratio of actual specific gravity/theoretical specific gravity and transmission losses at 1 GHz and 2 GHz were respectively measured in the same manner as Examples 1 to 7. The results are shown in Table 1 in combination. "Tg" means glass transition point.

TABLE 1

|  | Glass transition point | Softening point | Example 1 | Example 2 | Example 3 | Example 4 | Example 5 | Example 6 |
|---|---|---|---|---|---|---|---|---|
| Polyvinyl acetal resin | 61° C. | 110° C. | 100 | — | — | — | — | 100 |
| Polyvinyl acetal resin | 60° C. | 180° C. | — | 100 | — | — | — | — |
| Polyurethane elastomer | −55° C. | 100° C. | — | — | 100 | — | — | — |
| Polyurethane elastomer | −23° C. | 55° C. | — | — | — | 100 | — | — |
| Polyurethane resin | 83° C. | 160° C. | — | — | — | — | 100 | — |
| Polyurethane resin | −3° C. | 39° C. | — | — | — | — | — | — |
| Flattened Fe—Ni—Cr—Si |  |  | 471 | 471 | 450 | 430 | 420 | 471 |
| Epoxy resin 4% Flattened Fe—Ni—Cr—Si |  |  | — | — | — | — | — | — |
| Stearic acid |  |  | 4.2 | 4.2 | 4.1 | 3.9 | 3.8 | 4.2 |
| Barium stearate |  |  | 2.8 | 2.8 | 2.7 | 2.6 | 2.5 | 2.8 |
| Total |  |  | 578 | 578 | 557 | 536 | 526 | 578 |
| Toluene |  |  | — | — | 146 | 167 | 283 | — |
| Methylethyl ketone |  |  | 450 | 450 | — | 286 | 117 | 250 |
| Ethanol |  |  | 450 | 450 | — | — | — | 250 |
| Isopropyl alcohol |  |  | — | — | 67 | — | — | — |
| Ethyl acetate |  |  | — | — | 67 | — | — | — |
| Solvent total amount |  |  | 900 | 900 | 280 | 452 | 400 | 500 |
| Magnetic field alignment |  |  | — | — | — | — | — | — |
| Magnetic material vol % |  |  | 40% | 40% | 40% | 40% | 40% | 40% |
| Binder vol % |  |  | 56% | 56% | 56% | 56% | 56% | 56% |
| Theoretical specific gravity |  |  | 3.543 | 3.543 | 3.569 | 3.593 | 3.578 | 3.543 |
| Actual specific gravity |  |  | 2.000 | 2.800 | 3.110 | 2.110 | 2.430 | 2.300 |
| Actual specific gravity/theoretical gravity |  |  | 0.565 | 0.790 | 0.871 | 0.587 | 0.679 | 0.649 |
| Thickness 100 μm |  |  |  |  |  |  |  |  |
| Transmission loss 1 GHz |  |  | 0.238 | 0.324 | 0.358 | 0.141 | 0.234 | 0.220 |
| Transmission loss 2 GHz |  |  | 0.455 | 0.580 | 0.658 | 0.276 | 0.467 | 0.460 |
| Thickness 60 μm |  |  |  |  |  |  |  |  |
| Transmission loss 1 GHz |  |  | 0.200 | 0.264 | 0.284 | 0.102 | 0.211 | 0.186 |
| Transmission loss 2 GHz |  |  | 0.382 | 0.480 | 0.527 | 0.178 | 0.414 | 0.398 |

|  | Glass transition point | Softening point | Example 7 | Example 8 | Example 9 | Example 10 | Comparative Example 1 | Comparative Example 2 |
|---|---|---|---|---|---|---|---|---|
| Polyvinyl acetal resin | 61° C. | 110° C. | — | 100 | — | — | — | 100 |
| Polyvinyl acetal resin | 60° C. | 180° C. | — | — | — | — | — | — |
| Polyurethane elastomer | −55° C. | 100° C. | — | — | — | — | — | — |
| Polyurethane elastomer | −23° C. | 55° C. | — | — | — | — | — | — |
| Polyurethane resin | 83° C. | 160° C. | 75 | — | 75 | 75 | — | 25 |
| Polyurethane resin | −3° C. | 39° C. | 25 | — | 25 | 25 | 100 | 75 |
| Flattened Fe—Ni—Cr—Si |  |  | 420 | 471 | 420 | — | 430 | 420 |

TABLE 1-continued

| | | | | | | |
|---|---|---|---|---|---|---|
| Epoxy resin 4% | — | — | — | 550 | — | — |
| Flattened Fe—Ni—Cr—Si | | | | | | |
| Stearic acid | 3.8 | 4.2 | 5.0 | 5.0 | 3.9 | 3.8 |
| Barium stearate | 2.5 | 2.8 | 3.3 | 3.3 | 2.6 | 2.5 |
| Total | 526 | 578 | 658 | 658 | 536 | 526 |
| Toluene | 283 | — | 283 | 283 | 283 | 283 |
| Methylethyl ketone | 117 | 350 | 117 | 117 | 117 | 117 |
| Ethanol | — | 350 | — | — | — | — |
| Isopropyl alcohol | — | — | — | — | — | — |
| Ethyl acetate | — | — | — | — | — | — |
| Solvent total amount | 400 | 700 | 400 | 400 | 400 | 400 |
| Magnetic field alignment | — | ○ | ○ | — | — | — |
| Magnetic material vol % | 40% | 40% | 40% | 40% | 40% | 40% |
| Binder vol % | 56% | 56% | 56% | 55% | 56% | 56% |
| Theoretical specific gravity | 3.591 | 3.543 | 3.594 | 3.601 | 3.647 | 3.583 |
| Actual specific gravity | 2.040 | 2.180 | 2.224 | 2.266 | 1.580 | 1.570 |
| Actual specific gravity/theoretical gravity | 0.568 | 0.615 | 0.619 | 0.629 | 0.433 | 0.438 |
| Thickness 100 μm | | | | | | |
| Transmission loss 1 GHz | 0.191 | 0.274 | 0.220 | 0.231 | 0.100 | 0.100 |
| Transmission loss 2 GHz | 0.370 | 0.546 | 0.448 | 0.481 | 0.196 | 0.195 |
| Thickness 60 μm | | | | | | |
| Transmission loss 1 GHz | 0.135 | 0.226 | 0.151 | 0.167 | 0.095 | 0.095 |
| Transmission loss 2 GHz | 0.279 | 0.447 | 0.338 | 0.363 | 0.180 | 0.180 |

Table 1 shows that in the case of Examples 1 to 6 in which the elastomer or the resin having a glass transition point and/or a softening point of 50° C. or more was used, Example 7 in which the resin having a glass transition point of room temperature or more and the resin having a glass transition point of room temperature or less were contained at predetermined contents, Examples 8 and 9 in which the predetermined magnetic field was applied upon forming the sheet, and Example 10 in which the flattened soft magnetic powder resin-coated was used, the glass transition point was room temperature or less, and a transmission loss (amount of absorption) was higher in comparison with Comparative Example 1 in which the glass transition point and the softening point failed to satisfy the above-mentioned equation (I) and Comparative Example 2 in which the resin having a glass transition point of room temperature or more and the resin having a glass transition point of room temperature or less were not contained at predetermined contents.

Moreover, in Examples 3 and 4, the glass transition point was room temperature or less so that the glass transition point and the softening point indicated in parentheses satisfied the relationship of the above-mentioned equation (1) so that a rubber-like electromagnetic interference suppressor sheet that was superior in flexibility was obtained.

EXAMPLE 11, COMPARATIVE EXAMPLE 3

A magnetic paint was formed by using a composition shown in Table 2, and the paint was applied to PET (polyethylene terephthalate, a peeling support member) by using a doctor blade method, and this was subjected to a forceful drying process (hot-air drying) at a temperature of 50° C. to 80° C. so that a sheet was formed. Next, the peeling support member was separated, and electromagnetic interference suppressor sheets of the present invention having a thickness of 100 μm were obtained. With respect to the electromagnetic interference suppressor sheets thus obtained, the ratio of actual specific gravity/theoretical specific gravity and transmission losses at 1 GHz and 2 GHz were respectively measured. The results are shown in Table 2. The material constant in a range from 1 MHz to 10 GHz of this composition is shown in FIG. 10. The binder, used in this case, was prepared by blending a crosslinking agent with a polyester-based urethane resin, and as shown in FIG. 7, the storage modulus (E') near room temperature of this compound exceeds $10^7$ Pa without containing any filler.

TABLE 2

| | Comparative Example 3 | Example 11 |
|---|---|---|
| Polyester-based urethane resin | 100 | 100 |
| Soft magnetic metal | 750 | 750 |
| Crosslinking agent | 3 | 3 |
| Decabromodiphenyl ethane | 60 | 60 |
| Antimony trioxide | 30 | 30 |
| Phosphoric acid ester | 18 | 18 |
| Zinc stearate | | 7.5 |
| Surface resistivity (Ω/□) | $10^7$ | $10^7$ |
| Flame resistance (UL94V0) | ○ | ○ |
| Rust resistance | X | ○ |
| Thickness | 100 μm | |
| Transmission loss 1 GHz | 0.16 | 0.18 |
| Transmission loss 2 GHz | 0.4 | 0.44 |
| Permeability loss 100 MHz (dB) | 4.7 | 4.9 |
| Communication distance (mm) | 17 | 18 |

As clearly shown by Table 2, the electromagnetic interference suppressor of Example 11 containing zinc stearate exhibits high surface resistivity, and has good results with respect to the flame resistance and rust resistance. Moreover, with respect to the dispersing property also, good results are confirmed. In contrast, that of Comparative Example 3, which has the same composition except that zinc stearate is not contained, is inferior in the surface resistivity (measured by a Hirester UPMCP-HT 450 made by Dia Instruments Co., Ltd.

(in compliance with JIS K6911)), the flame resistance and the rust resistance.

(Evaluation Method of Rust Resistance)

The rust resistance was evaluated by a salt water spraying test. More specifically, a salt water spraying tester (CASSER-ISO-3, made by Suga Test Instruments Co., Ltd.) was used under the following testing conditions, and after the test, the surface of each of the electromagnetic interference suppressors was visually observed and evaluated under the following criteria.

Test Conditions
Concentration of sodium chloride solution: 5±0.5% by weight
Temperature of spraying chamber: 35±2° C.
Test time: 48 hours Evaluation criteria
◯: No rust was observed
x: Rust was observed (Measurements on Communication Distance by RFID System FeliCa Reader/Writer Evaluation Kit (13.56 MHz))

Figure 11:
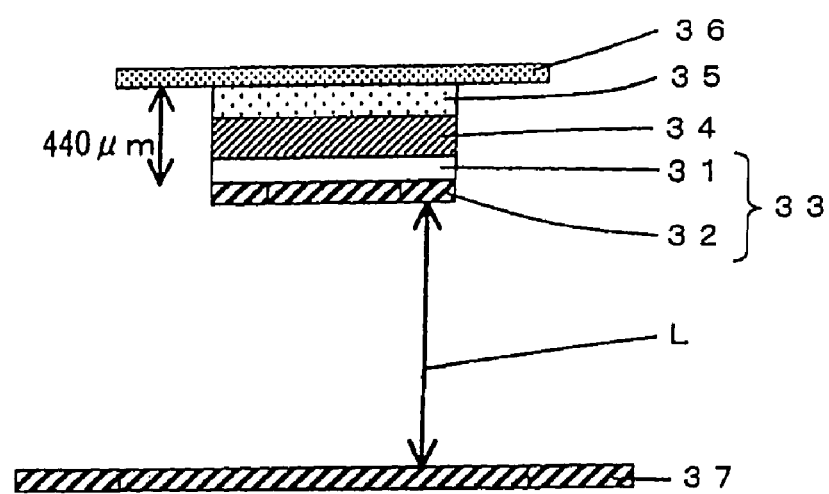
FIG. 11 is a cross-sectional view that schematically shows a FeliCa reader/writer evaluation kit used in Example 11.
Figure 12:
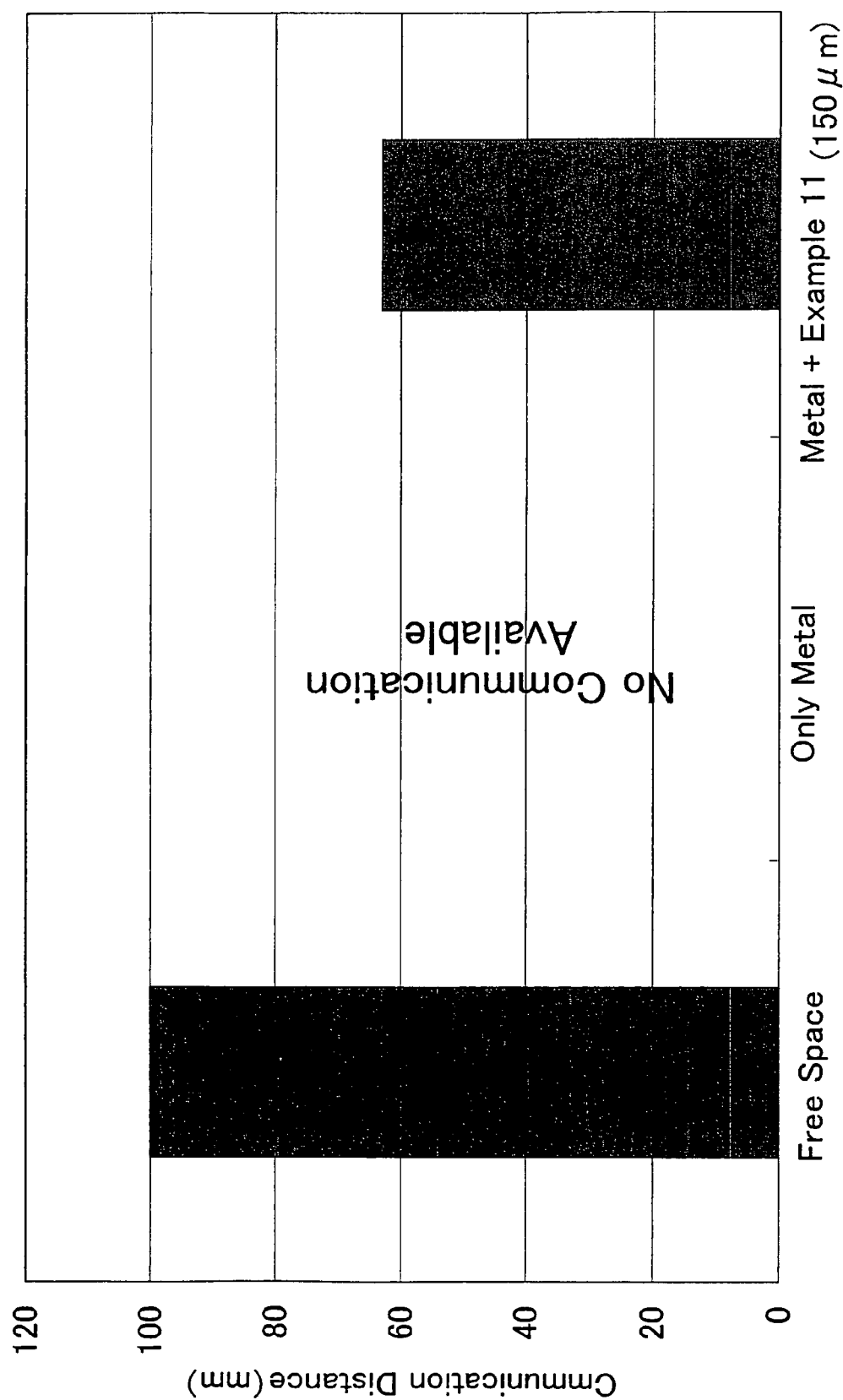
FIG. 12 is a graph that shows the results of evaluation made on the communication distance of a tag formed by using an electromagnetic interference suppressor of Example 11.

The communication distance between an IC tag and a reader/writer was measured by using a FeliCa reader/writer evaluation kit (FIG. 11) made by Sony Corporation. In this measuring method, as shown in FIG. 11, on the back surface of an IC tag 33 (0.76 mm in thickness) composed of a substrate 31 and a tag coil 32 formed on a surface of this substrate 31, an electromagnetic interference suppressor 34, a dielectric layer 35 and a metal plate 36 (communication disturbing member) were placed in this order, and in this stage a communication distance L between the IC tag 33 and the reader coil 37 (reader/writer) was measured. The results of measurements are shown in FIG. 12. The thickness of the electromagnetic interference suppressor 34 was set to 150 µm. In general, the communication distance L, which has been set to about 10 cm in the free space without the metal plate 36, becomes 0 cm in the case when the metal plate 36 is placed near the IC tag 33.

When the electromagnetic interference suppressor (150 µm in thickness) of Example 11 was placed between the metal plate 36 and the antenna of the IC tag 33, the communication distance became 6.3 cm so that a remarkable communication distance improving effect was confirmed.

In addition, an impedance adjusting function is one of the important effects of the electromagnetic interference suppressor. This function is explained below: In the case when metal (or a magnetic member) is located closely to a loop antenna, the impedance of the loop antenna is lowered, with the result that the resonance frequency of the antenna, designed in the free space environment, is shifted (in general, becomes higher). When the electromagnetic interference suppressor of the present invention is interposed between the metal (or a magnetic member) and the loop antenna, the shifted resonance frequency can be made closer to the initially designed frequency (for example, 13.56 MHz). The radio communication of the RF-ID system is also improved by this effect.

FIG. 13 shows the above-mentioned relationship by means of simulation. A high frequency electromagnetic field analyzing software program "SONNET", made by Sonnet Software, Inc., U.S.A, was used. FIG. 13 also shows the structure used in the simulation. In FIG. 13, the communication distance L was set to 45 mm.

In FIG. 13, M represents the free space, N represents a structure without a sheet, and P represents a structure with a magnetic sheet (that is, with an electromagnetic interference suppressor). Moreover, reference numeral 41 represents a reader coil (Reader), 42 is a tag coil (tag), 43 is a communication disturbing member, 44 is an electromagnetic interference suppressor, and 45 is a substrate.

In the simulation, on the reader/writer side (reader coil 41), the frequency is supposed to be adjusted to 13.56 MHz. When the antenna on the tag side is influenced by the metal closely located, the resonance frequency of the tag coil 42 is shifted toward the high frequency side. In this simulation, the shift was made from 13.56 MHz to as high as 28 MHz. This is because the neighboring metal caused a reduction in the reactance of the antenna on the tag side. As a result, the resonance frequencies between the reader/writer and the tag became different from each other to make weaker the electromagnetic inductive coupling required for communication.

When an electromagnetic interference suppressor 44 (indicated as "sheet" in a graph of FIG. 13) is inserted between the antenna of the tag coil 42 and the communication disturbing member 43 (neighboring metal member) in this state, the resonance frequency tends to be lowered in a reversed manner. If this reduced component can be cancelled by the increased component of the frequency by the metal, the shift of the frequency will not occur; however, actually, as the real part of the complex specific magnetic permeability of the electromagnetic interference suppressor 44 is raised, or as the thickness of the electromagnetic suppressor 44 is increased, the amount of reduction in the resonance frequency of the tag becomes greater, and the frequency finally becomes 13.56 MHz or less. In other words, even in the case that the electromagnetic interference suppressor 44 has a good performance (that is, even when the real part of the complex specific magnetic permeability is high), if there is a shift in the resonance frequency, the communication distance improving effect, which is supposed to be obtained by the electromagnetic interference suppressor, is no longer obtained.

When the electromagnetic interference suppressor 44 is used, in some cases, the resonance frequency needs to be corrected to 13.56 MHz. By making this correction, the effect of the electromagnetic interference suppressor 44 can be exerted to the maximum level, with the metal or magnetic sheet being attached, thereby making it possible to improve the radio communication distance. However, in the case that this is cancelled by the above-mentioned electromagnetic interference suppressor 44, such a correction is no longer required.

EXAMPLE 12

A magnetic paint was formed by using a composition shown in Table 3, and the electromagnetic interference suppressor sheet was obtained in the same manner as Example 11. With respect to the electromagnetic interference suppressor sheets thus obtained, the ratio of actual specific gravity/theoretical specific gravity, transmission losses at 1 GHz and 2 GHz and communication characteristics at 13.56 MHz were respectively measured. The results are shown in Table 3. FIG. 14 shows the results of measurements on the material constant in a range from 1 MHz to 10 MHz.

TABLE 3

|  | Example 12 |
| --- | --- |
| Polycarbonate-based urethane resin | 100 |
| Soft magnetic metal | 510 |
| Zinc stearate | 3 |

TABLE 3-continued

|  | Example 12 |
| --- | --- |
| Crosslinking agent | 3 |
| Surface resistivity (Ω/□) | $10^7$ |
| Rust resistance | ○ |
| Transmission loss 1 GHz | 0.42 |
| Transmission loss 2 GHz | 0.80 |
| Permeability loss 100 MHz (dB) | 5.7 |
| Permeability loss 500 MHz (dB) | 3.3 |
| Permeability loss 1 GHz (dB) | 2.1 |

The resin used in Table 3 is a polycarbonate-based urethane resin, and formed as a coating solution containing a crosslinking agent. Here, Tg of the urethane resin to be used is −17° C., and the urethane resin has a softening temperature of 130° C. and a storage modulus E' of 1 to 2 $10^8$ Pa (each of which is a measured value by DMA). This has a viscosity of about 200,000 cps (measured by B-type viscometer) prior to the coating process in a state in which a filler containing soft magnetic powder is blended, and this was applied onto PET by using a comma coater method, and dried (drying zone temperature=50° C. to 70° C.).

(Evaluation Method on Material Constant)

The material constants of the electromagnetic interference suppressor include a real part of a complex specific magnetic permeability and an imaginary part of the complex specific magnetic permeability as well as a real part of a complex specific dielectric constant and an imaginary part of the complex specific dielectric constant. The material was machined into rings (7 mm diameter 3 mm diameter), and measured by using a coaxial pipe method. The apparatuses used were a material analyzer (E4991A made by Agilent Technologies Co., Ltd.) with respect to a frequency range of 1 MHz to 1 GHz, and a network analyzer (8720ES made by Agilent Technologies Co., Ltd.) with respect to a frequency range of 50 MHz to 20 GHz.

The electromagnetic interference suppressor of the present invention provides the relationship that with respect to frequencies of 13.56 MHz or less, the real part $\mu'$ of a complex specific magnetic permeability becomes high (50 or more and the imaginary part $\mu''$ of the complex specific magnetic permeability becomes low (5 or less), and this indicates characteristics that easily collect magnetic fields, and hardly lose the collected magnetic fields. Moreover, the high real part $\in'$ (30 or more) of a complex specific dielectric constant indicates characteristics that easily collect lines of electric force, and the combination of the high levels of $\in'$ and $\mu'$ makes it possible to obtain a wavelength shortening effect, contributing to the size reduction of the antenna and the thinness of the electromagnetic suppressor. Moreover, since the imaginary part of the complex specific dielectric constant is low (500 or less), the conductivity of the electromagnetic interference suppressor itself is low, and this indicates that the resistance value is high, thereby indicating that no eddy current is generated from the electromagnetic interference suppressor.

EXAMPLE 13

The electromagnetic wave interference suppressor was formed in the same manner as Example 11, except that the resin-based compound used in Example 11 was applied onto a metal foil (Foil Top, made by Toyo Kohan Co., Ltd.: 50 μm in thickness) coated with a bonding agent. The measured results on the magnetic field shielding property are shown in Table 15.

Figure 15:
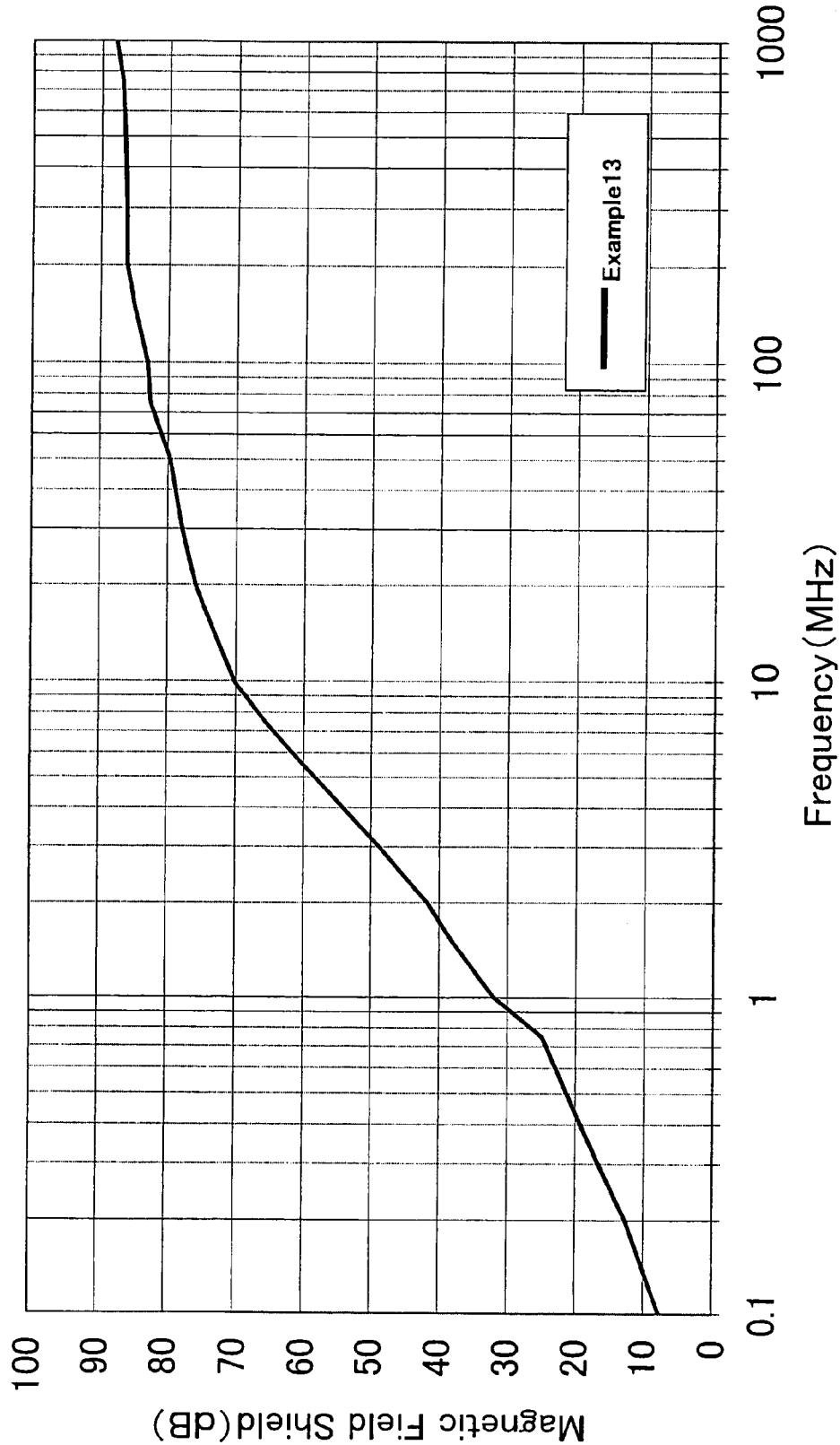
FIG. 15 is a graph that shows a magnetic field shielding property of an electromagnetic interference suppressor (magnetic shield sheet) in Example 13.

As clearly shown by FIG. 15, Example 13 provides a magnetic field shielding property of 30 dB or more in a range from 10 MHz to 1 GHz, with an electric field shielding property exceeding 60 dB in the same frequency band; thus, it is found that electromagnetic waves from radio waves and the like are desirably shielded.

EXAMPLE 14

The binder used in Table 4 was the same polycarbonate-based urethane resin as those used in Example 12, and prepared as a coating solution in which a crosslinking agent is blended. This had a viscosity of about 85,000 cps (measured by B-type viscometer) prior to the coating process in a state in which a filler containing soft magnetic powder was blended. This was formed into a sheet through the same method as Example 12.

TABLE 4

|  |  | Example 14 |
| --- | --- | --- |
| Binder |  | Polycarbonate-based urethane resin |
| Amount of metal filler |  | 70 vol % |
| Metal filler |  | Sendust 5 μm |
| Thermal conductivity (W/m · K) |  | 2.40 |
| Specific heat (J/g · K) |  | 0.31 |
| Surface resistance (Ω/□) |  | $3.00 \times 10^9$ |
| Transmission loss | 1 GHz | 0.14 |
|  | 2 GHz | 0.36 |
| Material constant | $\mu'$ | 7.6 |
|  | $\mu''$ | 5.1 |
|  | $\in'$ | 42 |
|  | $\in''$ | 2.6 |

Spherical particles (average particle size=about 5 μm) of Sendust alloy (Fe—Si—Al) were used as soft magnetic powder, and these were also allowed to function as a thermal conductive filler.

The material constants of the present electromagnetic interference suppressor are shown in FIG. 16, that is, at 1 GHz, the real part $\mu'$ of a complex specific magnetic permeability is 7.6, the imaginary part $\mu''$ thereof is 5.1, the real part $\in'$ of a complex specific dielectric constant $\in$ is 42, and the imaginary part $\in''$ thereof is 2.6. The surface resistivity is 1 $10^9$ Ω/□, which ensures a sufficient insulating property.

Moreover, the thermal conductivity, calculated from the specific heat and thermal diffusivity, was 2.4 W/m·K. Thus, the electromagnetic interference suppressor was considered to have a sufficient heat radiating property. Here, the specific heat of the sheet was measured by using a DSC made by Seiko Instruments Inc., and the thermal diffusivity was measured by a laser flash method thermal constant measuring device TC-7000 made by Ulvac, Inc.

The invention claimed is:

1. An electromagnetic interference suppressor of substantially unpressurized sheet form, which is obtained by applying and drying a magnetic paint, comprising:
   30 to 80% by volume of soft magnetic powder and 20 to 70% by volume of a binder,
   wherein the binder is an elastomer or a resin having a glass transition point and/or a softening point of 50° C. or more and having a storage modulus (E') of $10^7$ Pa (JIS K 7244-1) or more in a state containing neither solvent nor filler at room temperature.

2. An electromagnetic interference suppressor of substantially unpressurized sheet form, which is obtained by applying and drying a magnetic paint, comprising:

30 to 80% by volume of soft magnetic powder and 20 to 70% by volume of a binder, wherein the binder is an elastomer or a resin having a glass transition point of room temperature or less, with the glass transition point and the softening point being allowed to satisfy the following equation (I), and having a storage modulus (E') of $10^7$ Pa (JIS K 7244-1) or more in a state containing neither solvent nor filler at room temperature;

[Equation 4]

$$\text{Softening point} - \text{Glass transition point} \geq 45° \text{C}. \qquad (I)$$

3. An electromagnetic interference suppressor of substantially unpressurized sheet form, which is obtained by applying and drying a magnetic paint, comprising:

30 to 80% by volume of soft magnetic powder and 20 to 70% by volume of a binder, wherein the binder comprises 30 to 80% by weight of an elastomer or a resin having a glass transition point of room temperature or more, and 20 to 70% by weight of an elastomer or a resin having a glass transition point of less than room temperature, the glass transition points being allowed to satisfy the following equation (II), and the elastomer or the resin has a storage modulus (E') of $10^7$ Pa (JIS K 7244-1) or more in a state containing neither solvent nor filler at room temperature;

[Equation 5]

$$Tg1 - Tg2 \geq 20° \text{C}. \qquad (II)$$

Tg1: glass transition point of room temperature or more
Tg2: glass transition point of less than room temperature.

4. An electromagnetic interference suppressor of substantially unpressurized sheet form, which is obtained by applying and drying a magnetic paint, comprising:

30 to 80% by volume of soft magnetic powder and 20 to 70% by volume of a binder, wherein the magnetic paint contains a solvent having a boiling point of (room temperature+40° C.) or more, and the binder is an elastomer or a resin having a glass transition point and/or a softening point of (room temperature+40° C.) or more and having a storage modulus (E') of $10^7$ Pa (JIS K 7244-1) or more in a state containing neither solvent nor filler at room temperature.

5. The electromagnetic interference suppressor according to claim 4, wherein the drying process is a room temperature drying process.

6. The electromagnetic interference suppressor according to claim 4, wherein the drying process is a forceful drying process.

7. The electromagnetic interference suppressor according to claim 4, wherein a ratio of actual specific gravity/theoretical gravity is 0.5 or more.

8. The electromagnetic interference suppressor according to claim 4, wherein a higher fatty acid salt is contained.

9. The electromagnetic interference suppressor according to claim 8, wherein the higher fatty acid salt is zinc stearate.

10. The electromagnetic interference suppressor according to claim 4, wherein the surface of the soft magnetic powder is treated by a coupling agent, or is coated with a resin.

11. The electromagnetic interference suppressor according to claim 4, which has a real part ($\in'$) and an imaginary part ($\in''$) of a complex specific dielectric constant as well as a real part ($\mu'$) and an imaginary part ($\mu''$) of a complex specific magnetic permeability.

12. The electromagnetic interference suppressor according to claim 4, wherein in a frequency to be used in radio communications in an electromagnetic inductive system, as for the complex specific magnetic permeability, the real part ($\mu'$) is set to 30 or more and the imaginary part ($\mu'$) is set to 6 or less, and as for the complex specific dielectric constant, the real part ($\in'$) is set to 30 or more and the imaginary part ($\in''$) is set to 500 or less.

13. The electromagnetic interference suppressor according to claim 4, wherein in a frequency range of 50 MHz to 1 GHz, as for the complex specific magnetic permeability, the real part ($\mu'$) is set to 7 or more or the imaginary part ($\mu''$) is set to 5 or more.

14. The electromagnetic interference suppressor according to claim 4, wherein a flame retarder and/or a flame-retardant auxiliary are contained so as to impart a flame resistant property thereto.

15. The electromagnetic interference suppressor according to claim 4, wherein an adhesion agent layer or a bonding agent layer attached to at least one of the surfaces thereof.

16. The electromagnetic interference suppressor according to claim 4, which has a thermal conductive property.

17. A magnetic shield sheet comprising:
a conductive reflection layer; and
a magnetic layer comprising the electromagnetic interference suppressor according to claim 4, and provided on at least one surface of the conductive reflection layer,
wherein a magnetic shield property in a range of 10 MHz to 1 GHz, obtained by a KEC method or an Advantest method, is set to 20 dB or more.

18. An antenna device comprising:
an antenna element having a resonance frequency that is matched with a frequency to be used for radio communications; and
the electromagnetic interference suppressor according to claim 4, which is interposed between the antenna element and a communication disturbing member.

19. The antenna device according to claim 18, wherein the communication disturbing member is a metal member.

20. An electronic information transmitting apparatus equipped with the antenna device according to claim 18.

* * * * *